(12) United States Patent  
Nakagawa et al.

(10) Patent No.: US 6,780,778 B2  
(45) Date of Patent: Aug. 24, 2004

(54) METHOD FOR FABRICATING SEMICONDUCTOR DEVICE

(75) Inventors: Hideo Nakagawa, Kyoto (JP); Eiji Tamaoka, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 54 days.

(21) Appl. No.: 10/206,053

(22) Filed: Jul. 29, 2002

(65) Prior Publication Data

US 2002/0187638 A1 Dec. 12, 2002

Related U.S. Application Data

(62) Division of application No. 09/688,196, filed on Oct. 16, 2000, now Pat. No. 6,514,873.

(30) Foreign Application Priority Data

Dec. 14, 1999 (JP) .............................................. 11-353965

(51) Int. Cl.[7] ............................................ H01L 21/302
(52) U.S. Cl. ........................ 438/706; 438/725; 438/740
(58) Field of Search ................................ 438/691, 692, 438/694, 700, 702, 706, 725, 740

(56) References Cited

U.S. PATENT DOCUMENTS

| 5,550,007 | A | | 8/1996 | Taylor et al. |
| 5,924,005 | A | | 7/1999 | Waldo |
| 5,935,762 | A | | 8/1999 | Dai et al. |
| 6,001,739 | A | * | 12/1999 | Konishi ..................... 438/692 |
| 6,107,177 | A | | 8/2000 | Lu et al. |
| 6,136,644 | A | | 10/2000 | Tseng et al. |
| 6,294,314 | B1 | | 9/2001 | Liao |
| 6,475,904 | B2 | * | 11/2002 | Okoroanyanwu et al. ... 438/637 |

FOREIGN PATENT DOCUMENTS

| JP | 10-112503 | 4/1998 |
| JP | 10-209273 | 8/1998 |

* cited by examiner

Primary Examiner—Kin-Chan Chen  
(74) Attorney, Agent, or Firm—Nixon Peabody LLP; Donald R. Studebaker

(57) ABSTRACT

After an organic insulating film has been deposited over a semiconductor substrate, a silylated layer is formed selectively on the organic insulating film. Then, the organic insulating film is etched using the silylated layer as a mask, thereby forming an opening, which will be a via hole or interconnection groove, in the organic insulating film.

37 Claims, 23 Drawing Sheets

METHOD FOR FABRICATING SEMICONDUCTOR DEVICE

This application is a division of application Ser. No. 09/688,196 dated Oct. 16, 2000, now U.S. Pat. No. 6,514,873.

BACKGROUND OF THE INVENTION

The present invention relates to a method for fabricating a semiconductor device, in which a plug or inlaid interconnect is formed by a single or dual damascene process.

Recently, various methods of forming an inlaid interconnect for a semiconductor device by a single or dual damascene process have been researched and developed.

Hereinafter, a known method of fabricating a semiconductor device by a single damascene process (which will be herein called a "first prior art example" for convenience sake) will be described with reference to FIGS. 20(a) through 20(d).

First, as shown in FIG. 20(a), an insulating film 11, which may be either an SiO₂ film or a film with a dielectric constant lower than that of an SiO₂ film, is deposited over a semiconductor substrate 10. Next, as shown in FIG. 20(b), an etch stopper film 12 with insulation properties, which may be an Si₃N₄ film, for example, is deposited over the insulating film 11.

Then, as shown in FIG. 20(c), a resist pattern 13 is defined on the etch stopper film 12. And the insulating film 11 is plasma-etched using the resist pattern 13 as a mask, thereby forming an opening 14 that passes through the stopper and insulating films 12 and 11 as shown in FIG. 20(d). The opening 14 will be used as a via hole or interconnection groove. If the resist pattern 13 disappears as a result of the plasma etching process, then the etch stopper film 12 will be a hard mask.

Subsequently, the resist pattern 13 is stripped by an ashing process using oxygen plasma, and then the inner faces of the opening 14 are cleaned. Thereafter, although not shown, a metal film is deposited over the substrate to fill in the opening 14 and then parts of the metal film, which are exposed on the stopper film 12, are removed by a chemical/mechanical polishing (CMP) process, for example. In this manner, a plug or inlaid interconnect is formed inside the opening 14.

Hereinafter, another known method of fabricating a semiconductor device by a dual damascene process (which will be herein called a "second prior art example" for convenience sake) will be described with reference to FIGS. 21(a) through 21(d) and 22(a) through 22(c).

First, as shown in FIG. 21(a), a first insulating film 21, which may be either an SiO₂ film or a film with a dielectric constant lower than that of an SiO₂ film, is deposited over a semiconductor substrate 20. Next, a first etch stopper film 22 with insulation properties, which may be an Si₃N₄ film, for example, is deposited over the first insulating film 21.

Then, as shown in FIG. 21(b), a second insulating film 23, which may be either an SiO₂ film or a film with a dielectric constant lower than that of an SiO₂ film, is deposited over the first etch stopper film 22. Next, as shown in FIG. 21(c), a second etch stopper film 24 with insulation properties, which may be an Si₃N₄ film, for example, is deposited over the second insulating film 23.

Subsequently, as shown in FIG. 21(d), a first resist pattern 25 with an opening 25a for via hole is defined on the second etch stopper film 24. And the second etch stopper film 24, second insulating film 23, first etch stopper film 22 and first insulating film 21 are plasma-etched using the first resist pattern 25 as a mask, thereby forming a via hole 26 as shown in FIG. 22(a).

Thereafter, as shown in FIG. 22(b), a second resist pattern 27 with an opening 27a for interconnection groove is defined on the second stopper film 24. And the second etch stopper film 24 and second insulating film 23 are plasma-etched using the second resist pattern 27 as a mask, thereby forming an interconnection groove 28 as shown in FIG. 22(c). Subsequently, the second resist pattern 27 is stripped by an ashing process using oxygen plasma, and then the inner faces of the via hole 26 and interconnection groove 28 are cleaned.

Then, although not shown, a metal film is deposited over the substrate to fill in the via hole 26 and interconnection groove 28 and then parts of the metal film, which are exposed on the second etch stopper film 24, are removed by a CMP process, for example. In this manner, a dual damascene metallization structure is obtained.

The single damascene process of the first prior art example, however, has the following drawbacks. Specifically, when the resist pattern 13 is stripped by the ashing process using oxygen plasma, a damaged layer 15 is formed by the oxygen plasma on the inner walls of the insulating film 11 (i.e., parts the film 11 surrounding the opening 14) as shown in FIG. 23(a). In addition, the insulating film 11 is deformed and partially lost. In other words, the inner walls of the opening 14 in the insulating film 11 are dented inward unintentionally. As a result, the diameter (or diameter) of the opening 14 exceeds a predetermined value, i.e., the diameter of the opening of the etch stopper film 12.

To eliminate the process step of stripping the resist pattern 13 by the ashing process using the oxygen plasma, the resist pattern 13 may be removed by over-etching the insulating film 11 in the plasma etching process.

However, if the insulating film 11 is over-etched, then the following problems will newly arise.

First, if the insulating film 11 is either an inorganic insulating film or an organic/inorganic hybrid film, a CFC etching gas is normally used to plasma-etch the insulating film 11. Thus, if the over-etching process is performed for a long time, then a Teflon (polytetrafluoroethylene) film is formed on the inner walls of the opening 14. In that case, an ashing process should be performed for a long time or intensely to remove the Teflon film.

As a result of such an intense ashing process, a damaged layer will be formed in the insulating film 11, e.g., on the inner walls or on the bottom of the opening 14, or the insulating film 11 will be partially deformed. For example, the inner walls of the opening 14 might be partially etched away and deformed into a bowed shape. Particularly when the insulating film 11 is an organic/inorganic hybrid film, the damaged layer, which will be formed around the opening 14 of the insulating film 11, adversely increases the dielectric constant.

Next, if the insulating film 11 is an organic insulating film, then the insulating film 11 is normally plasma-etched using a gas containing oxygen or a mixture of nitrogen and hydrogen gases as the etching gas. However, if the over-etching process is performed for a long time using a gas containing oxygen as the etching gas, then the insulating film 11 will be partially deformed (i.e., the inner walls of the opening 14 will be dented inward). Or the damaged layer will be formed around the inner walls of the opening 14 to increase the dielectric constant unintentionally. On the other hand, if a mixture of nitrogen and hydrogen gases is used as the etching gas, then normally the inner walls of the opening 14 will not be dented so much as the process where the oxygen-containing gas is used. However, if the over-etching process is performed for a long time, then the insulating film 11 will also be partially deformed (i.e., the inner walls of the opening 14 will also be dented noticeably) or the damaged layer will also be formed around the inner walls of the opening 14. In addition, reactants (i.e., etching residue) will be deposited on the bottom of the opening 14. Accordingly, if the over-etching is performed for a rather long time, then the ashing process will also be needed, thus causing deformation or damage as well.

Considering these potential disadvantages, it is not preferable to over-etch the insulating film 11 for the purpose of eliminating the ashing process using the oxygen plasma.

The same problems arise in the dual damascene process of the second prior art example, too. Specifically, when the second resist pattern 27 is stripped by the ashing process using the oxygen plasma, the damaged layer 15 will be also formed by the oxygen plasma around the via hole 26 and/or interconnection groove 28 of the first and/or second insulating film(s) 21, 23. Or the first and/or second insulating film(s) 21, 23 will be partially deformed.

Also, as in the single damascene process, if the first and/or second insulating film(s) 21, 23 are/is over-etched during the plasma etching process, then the damaged layer will also be formed or the insulating film(s) 21, 23 will also be deformed partially.

These problems are even more serious for the dual damascene process. The reason will be described briefly. As shown in FIG. 23(b), if the opening 27a of the second resist pattern 27 is misaligned with the via hole 26, then part of the second resist pattern 27 will exist inside the via hole 26. Accordingly, even if the second resist pattern 27 is ashed using the oxygen plasma, a resist residue 27b of the second resist pattern 27 will still be left inside the via hole 26 and a damaged layer 29 will also be formed around the inner walls of the via hole 26 as shown in FIG. 23(c). In addition, the inner walls of the interconnection groove 28 will be dented inward and the width of its opening exceeds that of the opening of the second etch stopper film 24.

In that situation, the ashing process should be performed to remove the resist residue 27b or the over-etching process should be performed for a long time during the plasma etching process to avoid the formation of the resist residue 27b. However, in any case, the damage or deformation around the inner walls of the via hole 26 or interconnection groove 28 worsens.

Furthermore, an insufficient depth of focus is a problem commonly observable in the single and dual damascene processes. Specifically, a photolithographic process is needed to define a resist pattern. However, if the surface of an insulating film, which should be located under the resist pattern to be defined, is not flat enough, then a sufficient depth of focus cannot be attained during the exposure of the lithographic process. In that case, the resist pattern cannot be defined accurately, and fine via holes or interconnection grooves cannot be formed as intended.

SUMMARY OF THE INVENTION

An object of the invention to eliminate the resist residue from an insulating film in forming a via hole or interconnection groove through the insulating film by a single or dual damascene process, and prevent portions of the insulating film, surrounding the hole or groove, from being damaged or deformed.

To achieve this object, a first inventive method for fabricating a semiconductor device includes the steps of: a) depositing an organic insulating film over a semiconductor substrate; b) forming a silylated layer selectively on the organic insulating film; and c) etching the organic insulating film using the silylated layer as a mask, thereby forming an opening, which will be a via hole or interconnection groove, in the organic insulating film.

In the first method, an opening is formed by etching an organic insulating film using a silylated layer, which has been formed selectively on the organic insulating film, as a mask. Accordingly, no resist patterns are needed. That is to say, a resist-free process is realized and there is no need to perform the process step of ashing a resist pattern away or excessively over-etching the organic insulating film. Thus, the quality of the organic insulating film does not degrade and the inner walls of the opening are not damaged or deformed, either.

In one embodiment of the first method, the step b) preferably includes the steps of: terminating a surface of the organic insulating film with hydroxyls; selectively exposing the surface of the organic insulating film to a high-energy radiation, thereby removing the hydroxyls from exposed parts of the organic insulating film; and supplying a silylation reagent onto the selectively-exposed surface of the organic insulating film, thereby forming the silylated layer on the surface of non-exposed parts of the organic insulating film.

In such an embodiment, just the surface of the organic insulating film should be exposed to the high-energy beams but the deeper portions thereof need not. Thus, compared to the conventional resist process, a much greater margin is available for the depth of focus.

In another embodiment of the first method, the step b) may include the steps of: forming a layer to be silylated over the organic insulating film; selectively exposing a surface of the layer to be silylated to a high-energy radiation; supplying a silylation reagent onto the selectively-exposed surface of the layer to be silylated, thereby forming the silylated layer selectively in exposed or non-exposed parts of the layer to be silylated; and removing the exposed or non-exposed parts of the layer to be silylated, in which the silylated layer has not been formed.

In such an embodiment, just the layer to be silylated should be exposed to the high-energy beams. In addition, the layer to be silylated has only to be thick enough to resist the etching process of the organic insulating film. Thus, compared to the conventional resist process, a much greater margin is available for the depth of focus.

Moreover, since the silylated layer is formed selectively in exposed or non-exposed parts of the layer to be silylated that has been formed over the organic insulating film, the silylated layer can always be formed irrespective of the quality of the organic insulating film.

In still another embodiment, a porous insulating film may be used instead of the organic insulating film.

A second inventive method for fabricating a semiconductor device includes the steps of: a) depositing a first insulating film over a semiconductor substrate; b) forming a via hole through the first insulating film; c) depositing a second insulating film, which has an etch selectivity with respect to the first insulating film, over the first insulating film; d) forming a silylated layer selectively on the second insulating film; and e) etching the second insulating film using the silylated layer as a mask, thereby forming an interconnection groove through the second insulating film and removing part of the second insulating film that has been filled in the via hole.

In the second method, the opening is formed by etching the second insulating film using the silylated layer, which has been formed selectively on the second insulating film, as a mask. Accordingly, no resist patterns are needed. That is to say, a resist-free process is realized and there is no need to perform the process step of ashing a resist pattern away or excessively over-etching the second insulating film. Thus, the quality of the second insulating film does not degrade and the inner walls of the opening are not damaged or deformed, either.

A third inventive method for fabricating a semiconductor device includes the steps of: a) depositing a first insulating film over a semiconductor substrate; b) forming an etch stopper film over the first insulating film; c) forming a via hole through the first insulating and etch stopper films; d) depositing a second insulating film over the etch stopper film; e) forming a silylated layer selectively on the second insulating film; and f) etching the second insulating film using the silylated layer as a mask, thereby forming an interconnection groove through the second insulating film and removing part of the second insulating film that has been filled in the via hole.

As in the second method, the opening is formed according to the third method by etching the second insulating film using the silylated layer, which has been formed selectively on the second insulating film, as a mask. As a result, a resist-free process is realized. Thus, the quality of the second insulating film does not degrade and the inner walls of the opening are not damaged or deformed, either.

A fourth inventive method for fabricating a semiconductor device includes the steps of: a) depositing a first insulating film over a semiconductor substrate; b) forming an etch stopper film over the first insulating film; c) forming a via hole through the etch stopper film; d) depositing a second insulating film over the etch stopper film; e) forming a silylated layer selectively on the second insulating film; and f) etching the second and first insulating films using the silylated layer as a mask, thereby forming an interconnection groove through the second insulating film and another via hole through the first insulating film so that the via holes of the etch stopper and first insulating films are connected together.

As in the second method, the opening is formed according to the fourth method by etching the second insulating film using the silylated layer, which has been formed selectively on the second insulating film, as a mask. As a result, a resist-free process is realized. Thus, the quality of the second insulating film does not degrade and the inner walls of the opening are not damaged or deformed, either.

A fifth inventive method for fabricating a semiconductor device includes the steps of: a) depositing a first insulating film over a semiconductor substrate; b) forming an etch stopper film over the first insulating film; c) forming a via hole through the first insulating and etch stopper films; d) forming a plug by filling in the via hole with a metal film; e) depositing a second insulating film over the plug and the etch stopper film; f) forming a silylated layer selectively on the second insulating film; and g) etching the second insulating film using the silylated layer as a mask, thereby forming an interconnection groove through the second insulating film.

As in the second method, the opening is formed according to the fifth method by etching the second insulating film using the silylated layer, which has been formed selectively on the second insulating film, as a mask. As a result, a resist-free process is realized. Thus, the quality of the second insulating film does not degrade and the inner walls of the opening are not damaged or deformed, either.

In the second through fifth inventive methods, the diameter of the via hole may be greater than the width of the interconnection groove.

In such an embodiment, the area of contact between a lower-level interconnect, which is located closer to the semiconductor substrate, and an inlaid interconnect, which has been formed out of a conductor film filled in the interconnection groove, does not decrease.

In the second through fifth inventive methods, the width of the interconnection groove may be greater than the diameter of the via hole.

In such an embodiment, the area of contact between a lower-level interconnect, which is located closer to the semiconductor substrate, and a via contact, which has been formed out of a conductor film filled in the via hole, does not decrease.

In the second through fifth inventive methods, the second insulating film may be an organic insulating film. And the step of forming the silylated layer may include the steps of: terminating a surface of the second insulating film with hydroxyls; selectively exposing the surface of the second insulating film to a high-energy radiation, thereby removing the hydroxyls from exposed parts of the second insulating film; and supplying a silylation reagent onto the selectively-exposed surface of the second insulating film, thereby forming the silylated layer on the surface of non-exposed parts of the second insulating film.

In such an embodiment, just the surface of the second insulating film should be exposed to the high-energy beams but the deeper portions thereof need not. Thus, compared to the conventional resist process, a much greater margin is available for the depth of focus.

In the second through fifth inventive methods, the second insulating film may be an organic insulating film. And the step of forming the silylated layer may include the steps of: forming a layer to be silylated on the second insulating film; selectively exposing a surface of the layer to be silylated to a high-energy radiation; supplying a silylation reagent onto the selectively-exposed surface of the layer to be silylated, thereby forming the silylated layer selectively in exposed or non-exposed parts of the layer to be silylated; and removing the exposed or non-exposed parts of the layer to be silylated, in which the silylated layer has not been formed.

In such an embodiment, just the layer to be silylated should be exposed to the high-energy beams, and the layer to be silylated has only to be thick enough to resist the etching process of the second insulating film. Thus, compared to the conventional resist process, a much greater margin is available for the depth of focus.

In the second through fifth inventive methods, at least one of the first and second insulating films is preferably a porous insulating film.

In such an embodiment, a dielectric constant between contacts formed in the first insulating film and/or a dielectric constant between inlaid interconnects formed in the interconnection grooves of the second insulating film can be decreased.

In the second inventive method, the first insulating film is preferably an inorganic insulating film, organic/inorganic hybrid film or CVD organic insulating film, while the second insulating film is preferably an organic insulating film.

In such an embodiment, an inlaid interconnect, which will be formed in the interconnection groove of the second insulating film, can have its dielectric constant lowered.

In the third through fifth inventive methods, the first insulating film is preferably an organic insulating film or organic/inorganic hybrid film, while the second insulating film is preferably an organic insulating film.

In such an embodiment, a dielectric constant between inlaid interconnects, which will be formed in the interconnection grooves of the second insulating film, can be decreased.

A sixth inventive method for fabricating a semiconductor device includes the steps of: a) depositing a first insulating film over a semiconductor substrate; b) forming a first silylated layer selectively on the first insulating film; c) etching the first insulating film using the first silylated layer as a mask, thereby forming a via hole through the first insulating film; d) depositing a second insulating film over the first silylated layer; e) forming a second silylated layer selectively on the second insulating film; and f) etching the second insulating film using the second silylated layer as a mask, thereby forming an interconnection groove through the second insulating film and removing part of the second insulating film that has been filled in the via hole.

In the sixth method, the via hole is formed by etching the first insulating film using the first silylated layer, which has been formed selectively on the first insulating film, as a mask. And the interconnection groove is formed by etching the second insulating film using the second silylated layer, which has been formed selectively on the second insulating film, as a mask. As a result, a resist-free process is realized. Thus, the quality of the first or second insulating film does not degrade and the inner walls of the via hole or interconnection groove are not damaged or deformed, either.

In one embodiment of the sixth method, the first and second insulating films may be organic insulating films. The step b) may include the steps of: terminating a surface of the first insulating film with hydroxyls; selectively exposing the surface of the first insulating film to a high-energy radiation, thereby removing the hydroxyls from exposed parts of the first insulating film; and supplying a silylation reagent onto the selectively-exposed surface of the first insulating film, thereby forming the first silylated layer on the surface of non-exposed parts of the first insulating film. And the step e) may include the steps of: terminating a surface of the second insulating film with hydroxyls; selectively exposing the surface of the second insulating film to a high-energy radiation, thereby removing the hydroxyls from exposed parts of the second insulating film; and supplying a silylation reagent onto the selectively-exposed surface of the second insulating film, thereby forming the second silylated layer on the surface of non-exposed parts of the second insulating film.

In such an embodiment, just the surface of the first or second insulating film should be exposed to the high-energy beams but the deeper portions thereof need not. Thus, compared to the conventional resist process, a much greater margin is available for the depth of focus.

In another embodiment of the sixth method, the first and second insulating films may be organic insulating films. The step b) may include the steps of: forming a first layer to be silylated on the first insulating film; selectively exposing a surface of the first layer to be silylated to a high-energy radiation; supplying a silylation reagent onto the selectively-exposed surface of the first layer to be silylated, thereby forming the first silylated layer selectively in exposed or non-exposed parts of the first layer to be silylated; and removing the exposed or non-exposed parts of the first layer to be silylated, in which the first silylated layer has not been formed. And the step e) may include the steps of: forming a second layer to be silylated on the second insulating film; selectively exposing a surface of the second layer to be silylated to a high-energy radiation; supplying a silylation reagent onto the selectively-exposed surface of the second layer to be silylated, thereby forming the second silylated layer selectively in exposed or non-exposed parts of the second layer to be silylated; and removing the exposed or non-exposed parts of the second layer to be silylated, in which the second silylated layer has not been formed.

In such an embodiment, just the first or second layer to be silylated should be exposed to the high-energy beams. In addition, the first or second layer to be silylated has only to be thick enough to resist the etching process of the first or second insulating film. Thus, compared to the conventional resist process, a much greater margin is available for the depth of focus.

In yet another embodiment, at least one of the first and second insulating films is preferably a porous insulating film.

In such an embodiment, a dielectric constant between contacts formed in the first insulating film and/or a dielectric constant between inlaid interconnects formed in the interconnection grooves of the second insulating film can be decreased.

DESCRIPTION OF THE PREFERRED EMBODIMENTS

Embodiment 1

Hereinafter, a method for fabricating a semiconductor device according to a first embodiment of the present invention will be described with reference to FIGS. 1(a) through 1(d).

Figure 1A:
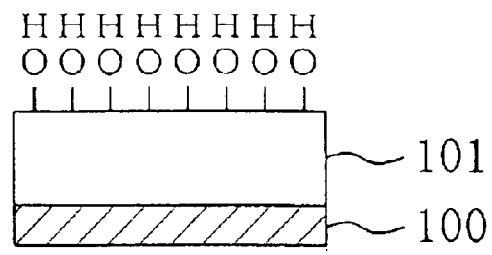
FIGS. 1(a) through 1(d) are cross-sectional views illustrating respective process steps for fabricating a semiconductor device according to a first embodiment of the present invention.

First, as shown in FIG. 1(a), an organic insulating film 101, which is made of polyallylether with a benzene ring and has a low dielectric constant, is deposited over a semiconductor substrate 100. Then, the surface of the organic insulating film 101 is terminated with hydroxyls (—OH groups). The method of terminating the surface of the organic insulating film 101 with the hydroxyls is not particularly limited. For example, the surface of the organic insulating film 101 may be exposed to a plasma producing hydroxyls, e.g., a plasma created from water vapor or gaseous alcohol.

Figure 1B:
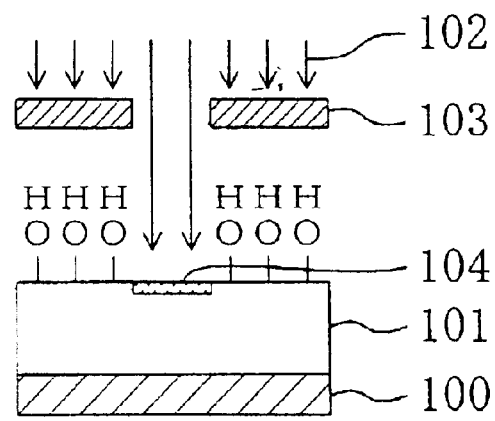

Next, as shown in FIG. 1(b), the surface of the organic insulating film 101 is selectively exposed to a high-energy radiation 102, e.g., KrF, ArF or $F_2$ excimer laser radiation or synchrotron orbit radiation (SOR), through a reticle 103. As a result, the hydroxyls are removed by ablation or photodesorption action from parts of the surface region of the organic insulating film 101 that have been exposed to the high-energy radiation 102 (i.e., exposed parts). On the other hand, the hydroxyls are left in the other parts of that surface region that have not been exposed to the high-energy radiation 102 (i.e., non-exposed parts). Thus, an altered layer 104 is formed in only those exposed parts of the organic insulating film 101 from which the hydroxyls have been removed.

Figure 1C:
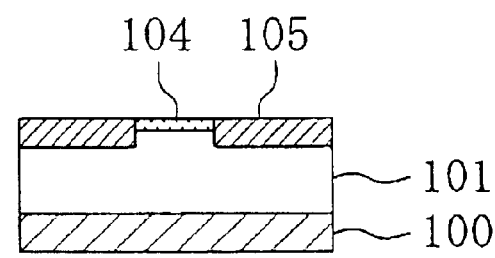

Next, a silylation process is carried out by exposing the surface of the organic insulating film 101 to vapor of hexamethyldisilazane (HMDS) with the semiconductor substrate 100 heated. As a result, a silylation reaction occurs on the surface of the non-exposed (i.e., non-altered) parts of the organic insulating film 101 that are terminated with the hydroxyls. Accordingly, a silylated layer 105 is formed selectively in the non-exposed parts of the organic insulating film 101 as shown in FIG. 1(c). Alternatively, the silylation process may be performed by exposing the surface of the organic insulating film 101 to a vapor of an organic silicon compound such as another silane coupling agent or a plasma containing an organic silicon compound like HMDS.

Figure 1D:
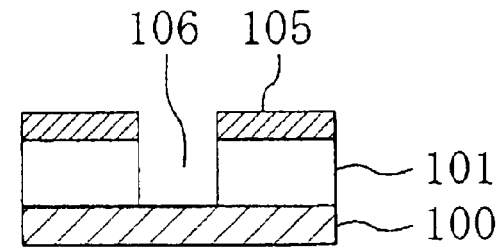

Subsequently, the organic insulating film 101 is plasma-etched using the silylated layer 105 as a mask, thereby forming an opening 106, which will be a via hole or interconnection groove, through the organic insulating film 101 as shown in FIG. 1(d). In this plasma etching process step, a plasma is preferably created from an etching gas mainly composed of oxygen, an etching gas containing nitrogen and hydrogen or an etching gas mainly composed of ammonium. This is because the opening 106 can be formed in a good shape with little residue left inside the opening 106. Also, to prevent the inner walls of the opening 106 of the organic insulating film 101 from being etched, a low-pressure plasma at several Pa or less is preferably used and the temperature of the substrate is preferably kept at room temperature or less during the plasma etching process.

Thereafter, the inner walls of the opening 106 are cleaned, a metal film (not shown) is deposited to fill in the opening 106 and parts of the metal film, exposed on the silylated layer 105, are removed by a CMP process, for example. In this manner, a plug or inlaid interconnect can be formed inside the opening 106. The metal film is preferably made of a metal with a low resistance. Examples of those low resistance metals include: Al; Al alloy (produced by adding Si and/or Cu to Al); Cu; Cu alloy mainly composed of Cu; Ag; and Au.

A multi-level interconnection structure can be obtained by repeatedly performing these process steps so that plugs and inlaid interconnects are alternately stacked one upon the other.

In the first embodiment, the opening 106 is formed by plasma-etching the organic insulating film 101 using the silylated layer 105, which has been formed selectively on the surface of the organic insulating film 101, as a mask. Accordingly, no resist patterns are needed.

In this manner, a resist-free process is realized and there is no need to perform the process step of ashing a resist pattern away or excessively over-etching the organic insulating film 101. Thus, the quality of the organic insulating film 101 does not degrade and the inner walls of the opening 106 are not damaged or deformed, either.

Generally speaking, where the high-energy radiation such as ArF excimer laser radiation is used for a lithographic process to define a resist pattern, the depth of focus will be relatively shallow because the exposing radiation has a relatively short wavelength. Thus, if the surface of an insulating film, which should be located under the resist pattern to be defined, is not flat enough, the resist pattern cannot be defined accurately. Specifically, the depth of focus of the ArF excimer laser radiation is normally ±300 nm or less, whereas the thickness of the resist film is usually 500 nm or more. Accordingly, the margin is insufficient.

In contrast, according to the first embodiment, just the surface of the organic insulating film 101 should be processed and partially altered in the lithographic process shown in FIG. 1(b). Thus, compared to the conventional resist process, a much greater margin is available.

Also, according to the first embodiment, the depth of focus depends solely on the surface planarity of the organic insulating film 101. Accordingly, even if the surface planarity of the semiconductor substrate 100 is not so good, the planarity of the organic insulating film 101 can be superior to that of the semiconductor substrate 100 if the organic insulating film 101 is formed by a spin coating process.

In this manner, according to the first embodiment, the problem of the depth of focus can be solved. In addition, the opening 106 to be a via hole or interconnection groove can be formed in a good shape with the surface planarity of the semiconductor substrate 100 increased.

Embodiment 2

Hereinafter, a method for fabricating a semiconductor device according to a second embodiment of the present invention will be described with reference to FIGS. 2(a) through 2(e).

Figure 2A:
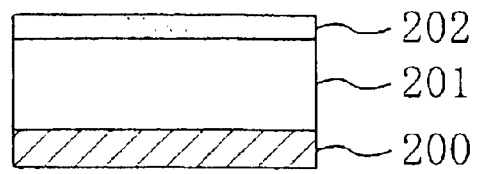
FIGS. 2(a) through 2(e) are cross-sectional views illustrating respective process steps for fabricating a semiconductor device according to a second embodiment of the present invention.

First, as shown in FIG. 2(a), an organic insulating film 201 with a low dielectric constant is deposited over a semiconductor substrate 200. Then, the surface of the organic insulating film 201 is coated with a chemically amplified resist, of which the main polymer is polyhydroxystyrene, for example, thereby forming a layer 202 to be silylated thereon.

Figure 2B:
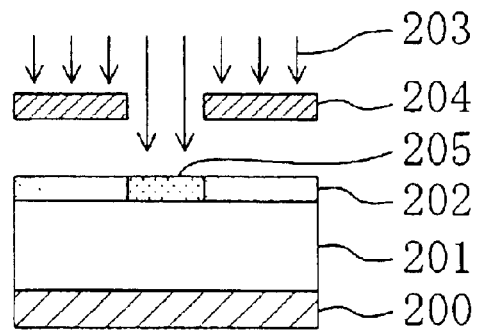

Next, as shown in FIG. 2(b), the surface of the layer 202 to be silylated is selectively exposed to a high-energy radiation 203 through a reticle 204. As a result, an altered layer 205 is formed in only those parts of the surface of the layer 202 to be silylated that have been exposed to the high-energy radiation 203 (i.e., exposed parts).

Figure 2C:
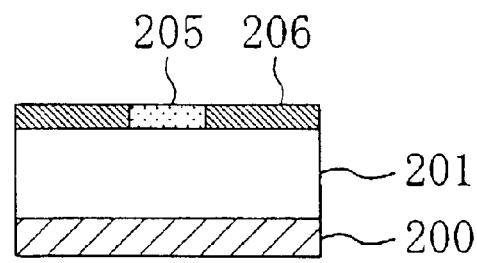

Subsequently, a silylation process is carried out by exposing the surface of the layer 202 to be silylated to a vapor of hexamethyldisilazane (HMDS) with the semiconductor substrate 200 heated. As a result, a silylation reaction occurs on the non-exposed parts of the layer 202 to be silylated. Accordingly, a silylated layer 206 is formed selectively in the non-exposed parts of the layer 202 to be silylated as shown in FIG. 2(c).

Figure 2D:
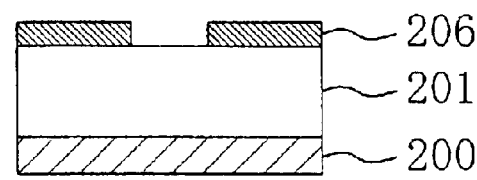
Figure 2E:
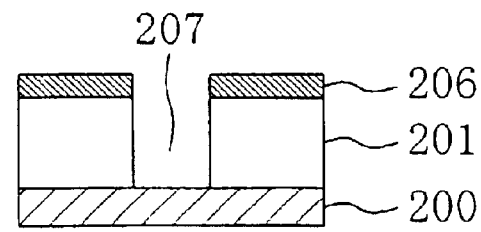

Subsequently, as shown in FIG. 2(d), the altered layer 205 is removed selectively and then the organic insulating film 201 is plasma-etched using the silylated layer 206 as a mask. In this manner, an opening 207, which will be a via hole or interconnection groove, is formed through the organic insulating film 201 as shown in FIG. 2(e). Depending on the material of the layer 202 to be silylated, the selective removal of the altered layer 205 and the formation of the opening 207 in the organic insulating film 201 can be performed continuously.

Thereafter, the inner walls of the opening 207 are cleaned, a metal film (not shown) is deposited to fill in the opening 207 and parts of the metal film, exposed on the silylated layer 206, are removed by a CMP process, for example. In this manner, a plug or inlaid interconnect can be formed inside the opening 207. The metal film is preferably made of a metal with a low resistance. Examples of those low-resistance metals include: Al; Al alloy (produced by adding Si and/or Cu to Al); Cu; Cu alloy mainly composed of Cu; Ag; and Au.

A multi-level interconnection structure can be obtained by repeatedly performing these process steps so that plugs and inlaid interconnects are alternately stacked one upon the other.

In the second embodiment, the opening 207 is formed by plasma-etching the organic insulating film 201 using the silylated layer 206, which has been formed selectively on the surface of the organic insulating film 201, as a mask. Accordingly, no resist patterns are needed. In this manner, a resist-free process is realized and there is no need to perform the process step of ashing a resist pattern away or excessively over-etching the organic insulating film 201. Thus, the quality of the organic insulating film 201 does not degrade and the inner walls of the opening 207 are not damaged or deformed, either.

In particular, according to the second embodiment, the layer 202 to be silylated is formed over the organic insulating film 201. Thus, even if it is difficult to terminate the surface of the organic insulating film 201 with hydroxyls due to the material of the organic insulating film 201, the silylated layer 206 still can be formed in the non-exposed parts of the organic insulating film 201. In other words, according to the second embodiment, the silylated layer 206 can always be formed irrespective of the material of the organic insulating film 201. Accordingly, this embodiment is effectively applicable to a high-function organic insulating film with a particularly high or low dielectric constant.

The thickness of the layer 202 to be silylated, which will be the silylated layer 206, may be somewhere between about 100 nm and about 200 nm. Thus, compared to a normal resist process using a resist film that should be at least 500 nm thick, the effective depth of focus can be increased by about two to fivefold. Accordingly, the problem of depth of focus can be solved. Also, the silylated layer 206 has only to have a minimum thickness needed for the layer 206 to resist the etching process of the organic insulating film 201. Thus, if the conditions for plasma etching of the organic insulating film 201 are optimized, the effective depth of focus can be further increased.

In the second embodiment, the silylated layer 206 is formed selectively in parts (i.e., the non-exposed parts) of the layer 202 to be silylated other than the altered layer 205 (i.e., the exposed parts). Alternatively, the silylated layer 206 may be formed selectively in the altered layer 205 (i.e., the exposed parts). For example, where the altered layer 205 is formed through a lithographic process using KrF or ArF excimer laser radiation, if the layer 202 to be silylated is formed out of a positive chemically amplified resist containing polyhydroxystyrene as a main polymer, then the non-exposed parts can be silylated. Conversely, if a negative chemically amplified resist is used, then the exposed parts can be silylated.

Embodiment 3

Hereinafter, a method for fabricating a semiconductor device according to a third embodiment of the present invention will be described with reference to FIGS. 3(a) through 4(d).

Figure 3A:
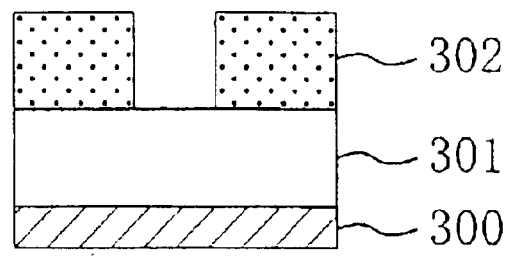
FIGS. 3(a) through 4(d) are cross-sectional views illustrating respective process steps for fabricating a semiconductor device according to a third embodiment of the present invention.

First, as shown in FIG. 3(a), a first insulating film 301 is deposited over a semiconductor substrate 300 and then a resist pattern 302 with an opening for forming a via hole (which will be herein called a "via hole opening") is defined on the first insulating film 301. The first insulating film 301 is preferably an inorganic insulating film like $SiO_2$ or SiOF film or an inorganic insulating film containing an organic component or material.

Figure 3B:
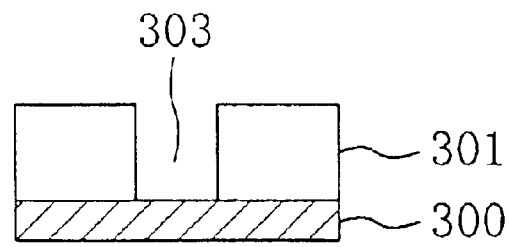
Figure 3C:
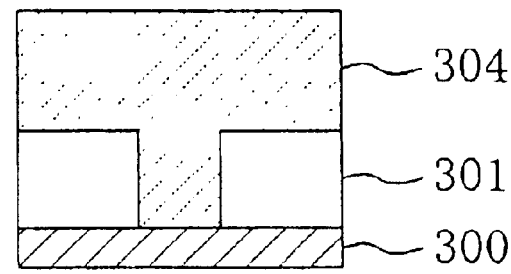

Next, the first insulating film 301 is plasma-etched using the resist pattern 302 as a mask, thereby forming a provisional via hole 303 through the first insulating film 301 as shown in FIG. 3(b). Then, as shown in FIG. 3(c), a second insulating film 304 is deposited over the entire surface of the first insulating film 301. As a result, the provisional via hole 303 is filled in with the second insulating film 304. The second insulating film 304 is preferably an organic film, which has an etch selectivity with respect to the first insulating film 301 and has a low dielectric constant.

Figure 3D:
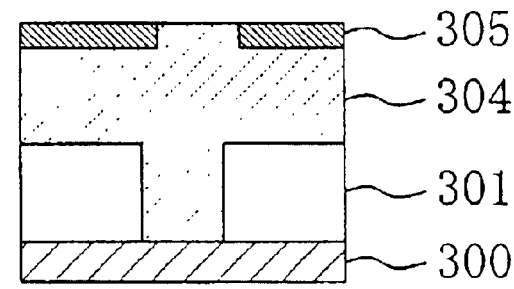

Subsequently, as shown in FIG. 3(d), a silylated layer 305 is selectively formed in parts of the surface region of the second insulating film 304, where no interconnection grooves will be formed, as in the first embodiment. In other words, the silylated layer 305 will have an opening in a region where an interconnection groove will be formed.

Figure 4A:
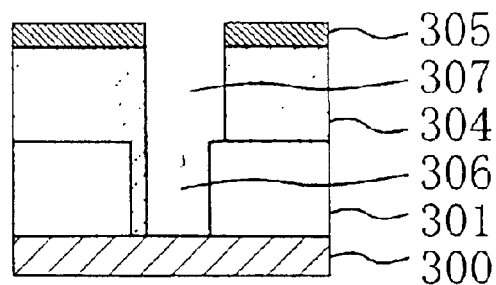
Figure 4B:
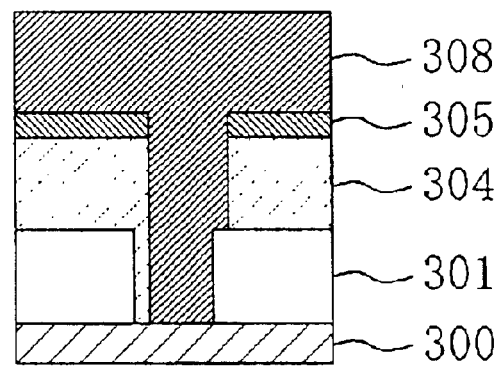

Thereafter, the second insulating film 304 is plasma-etched using the silylated layer 305 as a mask, thereby removing part of the second insulating film 304 that has been filled in the provisional via hole 303. As a result, a real via hole 306 is formed through the first insulating film 301, and an interconnection groove 307 is formed through the second insulating film 304 as shown in FIG. 4(a). In this plasma etching process, a plasma is preferably created from an etching gas mainly composed of oxygen, an etching gas containing nitrogen and hydrogen or an etching gas mainly composed of ammonium. This is because the via hole 306 and interconnection groove 307 can be formed in good shapes with little residue left inside the via hole 306 and interconnection groove 307.

Figure 4C:
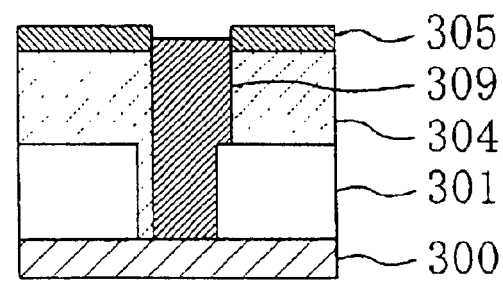

Thereafter, the semiconductor substrate 300 is cleaned, a metal film 308 is deposited to fill in the real via hole 306 and interconnection groove 307 and then parts of the metal film 308, exposed on the silylated layer 305, are removed by a CMP process, for example. In this manner, a metal interconnect 309 with a dual damascene structure can be obtained as shown in FIG. 4(c). The metal film 308 is preferably made of a metal with a low resistance. Examples of those low-resistance metals include: Al; Al alloy (produced by adding Si and/or Cu to Al); Cu; Cu alloy mainly composed of Cu; Ag; and Au.

According to the third embodiment, the real via hole 306 and interconnection groove 307 are formed by plasma-etching the second insulating film 304 using the silylated layer 305, which has been formed selectively on the surface of the second insulating film 304, as a mask. Accordingly, no resist patterns are needed in this process step.

That is to say, a resist-free process is realized and there is no need to perform the process step of ashing a resist pattern away or excessively over-etching the second insulating film 304. Thus, the quality of the second insulating film 304 does not degrade and the shapes of the real via hole 306 and interconnection groove 307 are not deformed, either.

Also, part of the second insulating film 304 might be left inside the real via hole 306 as shown in FIG. 4(a). However, unlike the conventional process, no resist residue is left there and no oxygen plasma ashing is needed. Even if an ashing process is required, the ashing process should be performed much less intensively for just a short time. Thus, the inner walls of the real via hole 306 and interconnection groove 307 are damaged just a little bit.

In addition, as in the first embodiment, only the surface of the second insulating film 304 should be processed to form the silylated layer 305 by the lithographic process. Thus, compared to the conventional resist process, a much greater margin is available.

Furthermore, in the third embodiment, the first insulating film 301 is either an inorganic insulating film or an organic-component-containing inorganic insulating film, while the second insulating film 304 is an organic insulating film. Thus, when the second insulating film 304 is formed by spin-coating an organic insulating material, the material can be applied just as intended. In addition, a mixed layer is unlikely to be formed in the interface between the first and second insulating films 301 and 304. Also, even though no etch stopper film is provided on the first insulating film 301, the second insulating film 304 can be etched without etching the first insulating film 301 in the process step shown in FIG. 4(a) where the second insulating film 304 is plasma-etched. Accordingly, the metal interconnect 309 can have a dual damascene structure in a good shape as shown in FIG. 4(c).

Moreover, the first insulating film 301 may have a multilayer structure consisting of a lower organic insulating film and an upper inorganic insulating film of $SiO_2$ or $Si_3N_4$, for example. In that case, even if the second insulating film 304 is not an organic insulating film that has been deposited by a chemical vapor deposition (CVD) process, the metal interconnect 309 still can have a dual damascene structure in a good shape. In this alternative embodiment, the upper inorganic insulating film may be etched using the silylated layer as a mask, and then the lower organic insulating film may be etched using the silylated layer and the upper inorganic insulating film as a mask. In this manner, the silylated layer 305 over the first insulating film 301 can be further thinned. As a result, the effective depth of focus can be further increased.

Figure 4D:
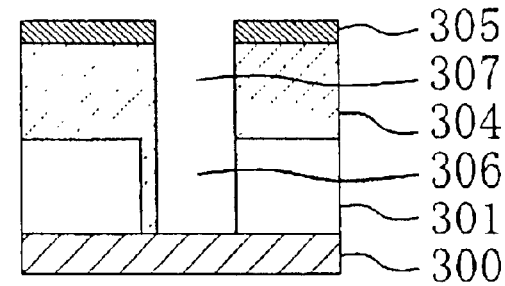

If the opening of the silylated layer 305 for interconnection groove might be misaligned with the provisional via hole 303, then the first insulating film 301 is preferably an organic insulating film made of amorphous carbon. In that case, when the second insulating film 304 is formed by a spin coating process, no mixing layer is likely to be formed in the interface between the first and second insulating films 301 and 304. In addition, when the second insulating film 304 is plasma-etched, the first insulating film 301 is also etched. Accordingly, the area of contact between the real via hole 306 and the interconnection groove 307 does not decrease as shown in FIG. 4(d).

Also, when the second insulating film 304 is an inorganic or organic insulating film that has been deposited by a CVD process, the first and second insulating films 301 and 304 are preferably made of the same material. Then, the area of contact between the real via hole 306 and interconnection groove 307 does not decrease, either, as shown in FIG. 4(d). In that case, however, the plasma etching process for forming the real via hole 306 and interconnection groove 307 or the cleaning process after the etching is over cannot be performed just as intended.

Embodiment 4

Hereinafter, a method for fabricating a semiconductor device according to a fourth embodiment of the present invention will be described with reference to FIGS. 5(a) through 6(c).

Figure 5A:
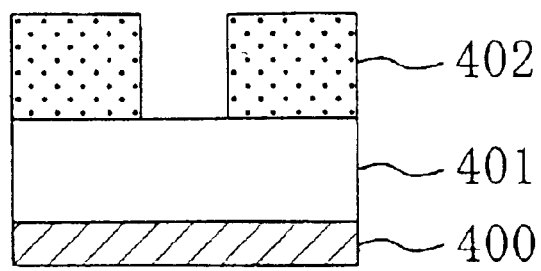
FIGS. 5(a) through 6(c) are cross-sectional views illustrating respective process steps for fabricating a semiconductor device according to a fourth embodiment of the present invention.

First, as shown in FIG. 5(a), a first insulating film 401, which may be either an inorganic insulating film or organic-component-containing inorganic insulating film, is deposited over a semiconductor substrate 400. Then, a resist pattern 402 with a via hole opening is defined on the first insulating film 401 by a known lithographic process.

Figure 5B:
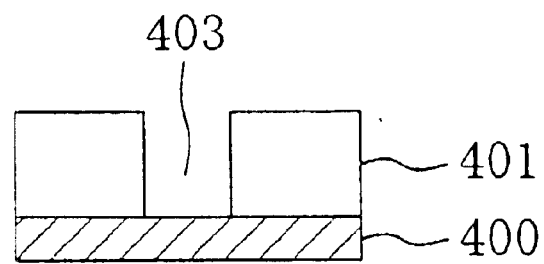
Figure 5C:
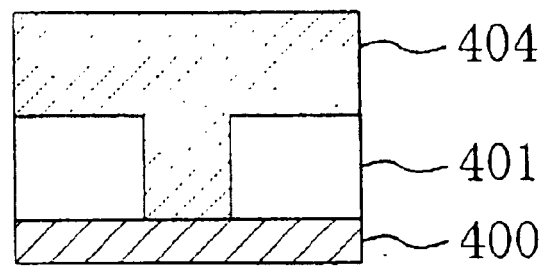

Next, the first insulating film 401 is plasma-etched using the resist pattern 402 as a mask, thereby forming a provisional via hole 403 through the first insulating film 401 as shown in FIG. 5(b). Then, as shown in FIG. 5(c), a second insulating film 404, which is an organic insulating film, is deposited over the entire surface of the first insulating film 401. As a result, the provisional via hole 403 is filled in with the second insulating film 404.

Figure 5D:
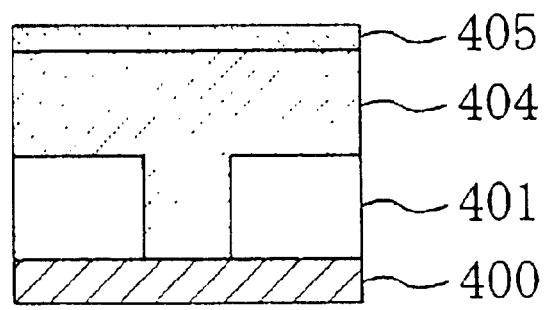

Then, as shown in FIG. 5(d), the surface of the second insulating film 404 is coated with a chemically amplified resist, of which the main polymer is polyhydroxystyrene, for example, thereby forming a layer 405 to be silylated thereon.

Figure 6A:
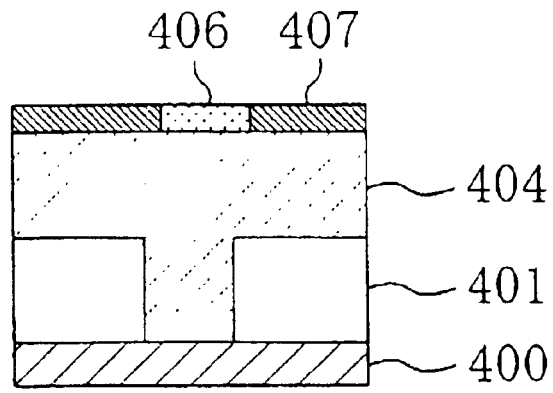

Next, as in the second embodiment, the surface of the layer 405 to be silylated is selectively exposed to a high-energy radiation through a reticle. As a result, an altered layer 406 is formed in only the exposed parts of the surface of the layer 405 to be silylated as shown in FIG. 6(a). Subsequently, a silylation process is carried out by exposing the surface of the layer 405 to be silylated to a vapor of hexamethyldisilazane (HMDS) with the semiconductor substrate 400 heated. As a result, a silylated layer 407 is formed selectively in the non-exposed parts of the layer 405 to be silylated as shown in FIG. 6(a).

Figure 6B:
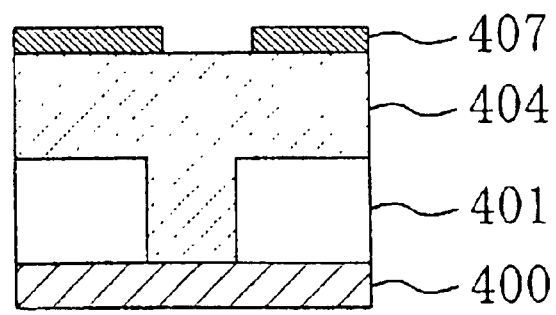
Figure 6C:
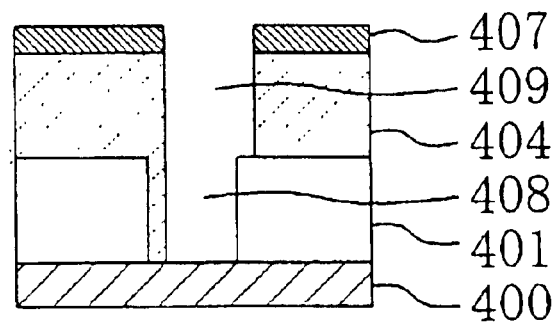

Subsequently, as shown in FIG. 6(b), the altered layer 406 is removed selectively and then the second insulating film 404 is plasma-etched using the silylated layer 407 as a mask. In this manner, a real via hole 408 is formed by removing part of the second insulating film 404 that has been filled in the provisional via hole 403 and an interconnection groove 409 is formed through the second insulating film 404 as shown in FIG. 4(c).

Thereafter, the semiconductor substrate 400 is cleaned, a metal film (not shown) is deposited to fill in the real via hole 408 and interconnection groove 409 and then parts of the metal film, exposed on the silylated layer 407, are removed by a CMP process, for example. In this manner, a metal interconnect with a dual damascene structure is obtained.

According to the fourth embodiment, the real via hole 408 and interconnection groove 409 are formed by plasma-etching the second insulating film 404 using the silylated layer 407, which has been formed selectively on the surface of the second insulating film 404, as a mask. As a result, a resist-free process is realized and there is no need to perform the process step of ashing a resist pattern away or excessively over-etching the second insulating film 404. Thus, the quality of the second insulating film 404 does not degrade and the shapes of the real via hole 408 and interconnection groove 409 are not deformed, either.

Also, as in the second embodiment, even if it is difficult to terminate the surface of the second insulating film 404 with hydroxyls due to the material of the second insulating film 404, the silylated layer 407 still can be formed in the non-exposed parts of the second insulating film 404. That is to say, according to the fourth embodiment, the silylated layer 407 can always be formed irrespective of the material of the second insulating film 404.

Embodiment 5

Hereinafter, a method for fabricating a semiconductor device according to a fifth embodiment of the present invention will be described with reference to FIGS. 7(a) through 8(c).

Figure 7A:
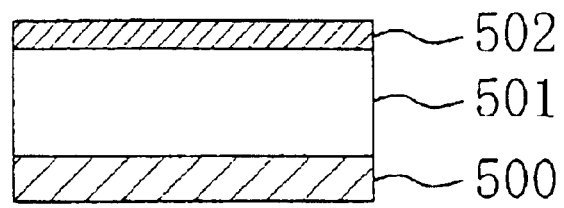
FIGS. 7(a) through 8(c) are cross-sectional views illustrating respective process steps for fabricating a semiconductor device according to a fifth embodiment of the present invention.
Figure 7B:
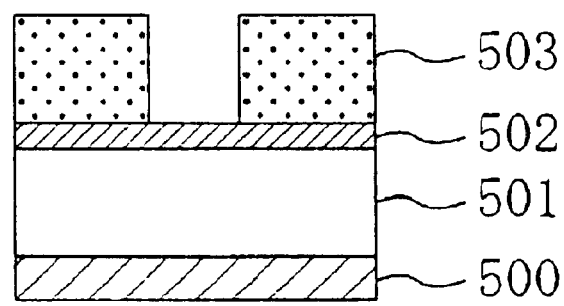

First, as shown in FIG. 7(a), a first insulating film 501 is deposited over a semiconductor substrate 500 and an etch stopper film 502 is formed on the first insulating film 501. Then, a resist pattern 503 with a via hole opening is defined on the etch stopper film 502 as shown in FIG. 7(b).

Figure 7C:
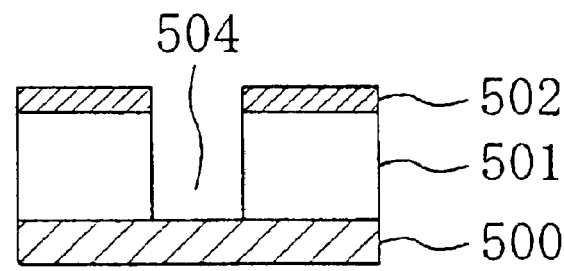
Figure 8A:
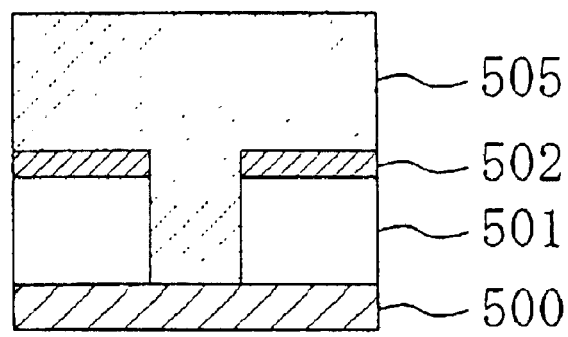

Next, the etch stopper film 502 and first insulating film 501 are plasma-etched using the resist pattern 503 as a mask, thereby forming a provisional via hole 504 through the first insulating film 501 and etch stopper film 502 as shown in FIG. 7(c). Then, as shown in FIG. 8(a), a second insulating film 505 is deposited over the entire surface of the etch stopper film 502. As a result, the provisional via hole 504 is filled in with the second insulating film 505.

Figure 8B:
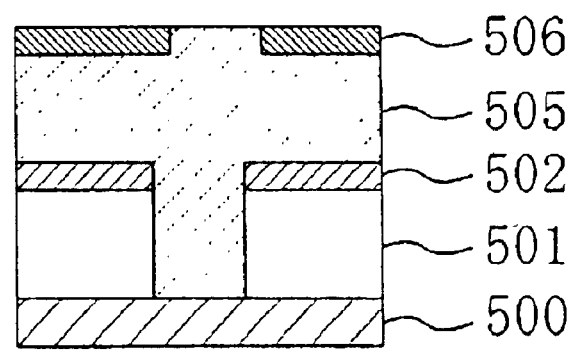

Then, as shown in FIG. 8(b), a silylated layer 506 is selectively formed in parts of the surface region of the second insulating film 505, where no interconnection grooves will be formed. In other words, the silylated layer 506 will have an opening in a region where an interconnection groove will be formed.

Figure 8C:
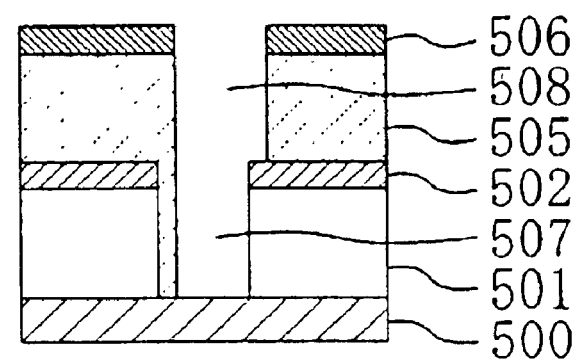

Thereafter, the second insulating film 505 is plasma-etched using the silylated layer 506 as a mask, thereby removing part of the second insulating film 505 that has been filled in the provisional via hole 504. As a result, a real via hole 507 is formed through the first insulating film 501 and an interconnection groove 508 is formed through the second insulating film 505 as shown in FIG. 8(c).

Thereafter, the semiconductor substrate 500 is cleaned, a metal film (not shown) is deposited to fill in the real via hole 507 and interconnection groove 508 and then parts of the metal film, exposed on the silylated layer 506, are removed by a CMP process, for example. In this manner, a metal interconnect with a dual damascene structure is obtained.

In the fifth embodiment, the etch stopper film 502 is formed between the first and second insulating films 501 and 505. Thus, no etch selectivity is needed between the first and second insulating films 501 and 505. Accordingly, even if the first and second insulating films 501 and 505 are both organic insulating films formed by a spin coating process, the second insulating film 505 can be formed just as intended without forming any mixed layer between the first and second insulating films 501 and 505. Alternatively, the first and second insulating films 501 and 505 may be an organic/inorganic hybrid film and an organic insulating film, respectively. This is because when the second insulating film 505 is plasma-etched, the exposed parts of the first insulating film 501 do not shrink due to the exposure to the plasma. Thus, the metal interconnect can have the exactly intended dual damascene structure.

Also, in the fifth embodiment, the provisional via hole 504 is formed through the first insulating film 501 and etch stopper film 502 as shown in FIG. 7(c). Alternatively, the process sequence of the fifth embodiment may be advanced with the provisional via hole 504 formed only through the etch stopper film 502 without etching the first insulating film 501. This is because the same results as those of the fifth embodiment are still attainable if the first and second insulating films 501 and 505 are made of the same material or exhibit almost equivalent properties to plasma etching. If the first and second insulating films 501 and 505 are made of dissimilar materials, then the second and first insulating films 505 and 501 may be etched at two steps in this order using the silylated layer 506 as a mask. The same results as those of the fifth embodiment will also be attainable in that case.

Embodiment 6

Hereinafter, a method for fabricating a semiconductor device according to a sixth embodiment of the present invention will be described with reference to FIGS. 9(a) through 10(d).

Figure 9A:
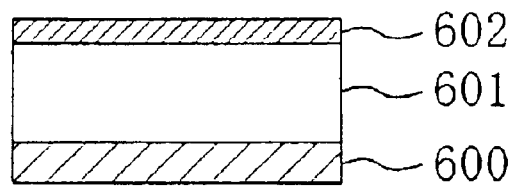
FIGS. 9(a) through 10(d) are cross-sectional views illustrating respective process steps for fabricating a semiconductor device according to a sixth embodiment of the present invention.
Figure 9B:
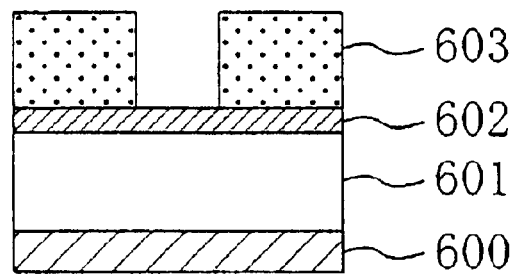

First, as shown in FIG. 9(a), a first insulating film 601 is deposited over a semiconductor substrate 600 and an etch stopper film 602 is formed on the first insulating film 601. Then, a resist pattern 603 with a via hole opening is defined on the etch stopper film 602 as shown in FIG. 9(b).

Figure 9C:
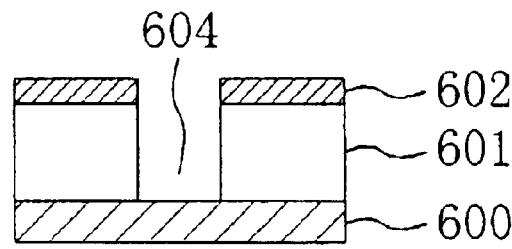
Figure 9D:
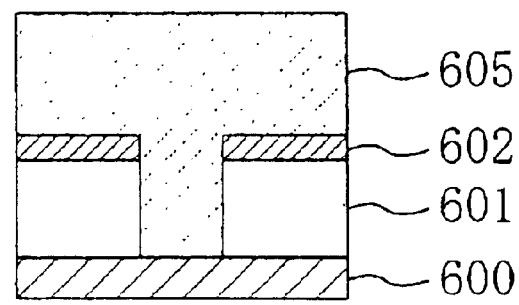

Next, the etch stopper film 602 and first insulating film 601 are plasma-etched using the resist pattern 603 as a mask, thereby forming a provisional via hole 604 through the first insulating film 601 and etch stopper film 602 as shown in FIG. 9(c). Then, as shown in FIG. 9(d), a second insulating film 605 is deposited over the entire surface of the etch stopper film 602. As a result, the provisional via hole 604 is filled in with the second insulating film 605.

Figure 10A:
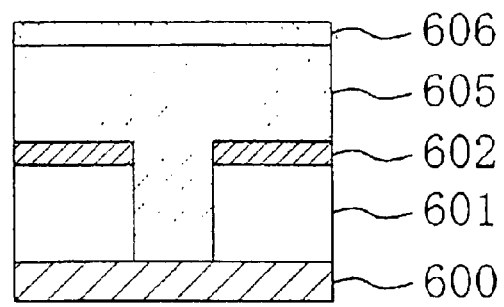
Figure 10B:
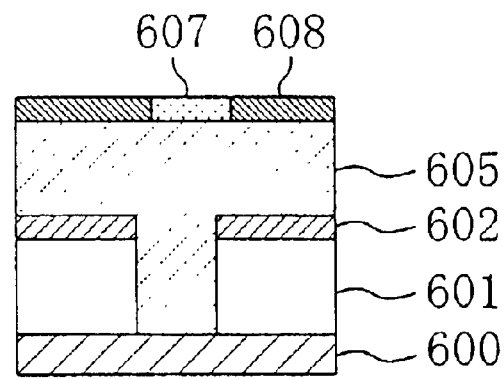

Then, as shown in FIG. 10(a), the surface of the second insulating film 605 is coated with a chemically amplified resist, of which the main polymer is polyhydroxystyrene, for example, thereby forming a layer 606 to be silylated thereon. Next, the surface of the layer 606 to be silylated is selectively exposed to a high-energy radiation through a reticle. As a result, an altered layer 607 is formed in only the exposed parts of the surface of the layer 606 to be silylated as shown in FIG. 10(b). Subsequently, a silylation process is carried out by exposing the surface of the layer 606 to be silylated to a vapor of hexamethyldisilazane (HMDS). As a result, a silylated layer 608 is formed selectively in the non-exposed parts of the layer 606 to be silylated as shown in FIG. 10(b).

Figure 10C:
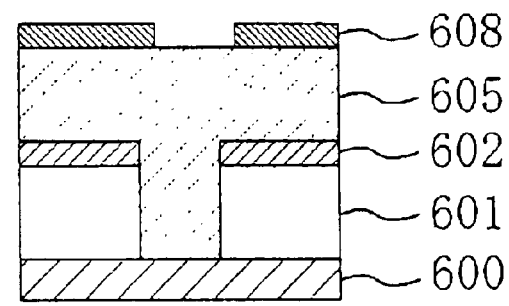
Figure 10D:
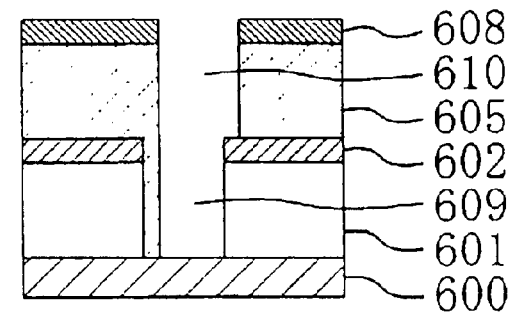

Subsequently, after the altered layer 607 has been selectively removed as shown in FIG. 10(c), the second insulating film 605 is plasma-etched using the silylated layer 608 as a mask. In this manner, a real via hole 609 is formed by removing part of the second insulating film 605 that has been filled in the provisional via hole 604 and an interconnection groove 610 is formed through the second insulating film 605 as shown in FIG. 10(d).

Thereafter, the semiconductor substrate 600 is cleaned, a metal film (not shown) is deposited to fill in the real via hole 609 and interconnection groove 610 and then parts of the metal film, exposed on the silylated layer 608, are removed by a CMP process, for example. In this manner, a metal interconnect with a dual damascene structure is obtained.

In the sixth embodiment, the etch stopper film 602 is formed between the first and second insulating films 601 and 605 as in the fifth embodiment. Thus, no etch selectivity is needed between the first and second insulating films 601 and 605.

Also, as in the second embodiment, the silylated layer 608 is formed in the non-exposed parts of the layer 606 to be silylated on the second insulating film 605. Thus, the silylated layer 608 can always be formed irrespective of the quality of the second insulating film 605.

Furthermore, in the sixth embodiment, the provisional via hole 604 is formed through the first insulating film 601 and etch stopper film 602 as shown in FIG. 9(c). Alternatively, the process sequence of the sixth embodiment may be advanced with the provisional via hole 604 formed only through the etch stopper film 602 without etching the first insulating film 601. This is because the same results as those of the sixth embodiment are still attainable as mentioned in describing the alternatives for the fifth embodiment.

Embodiment 7

Hereinafter, a method for fabricating a semiconductor device according to a seventh embodiment of the present invention will be described with reference to FIGS. 11(a) through 11(e).

Figure 11A:
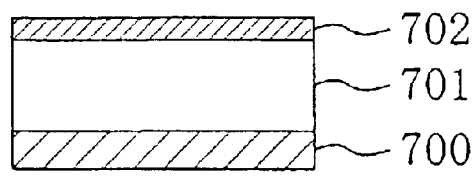
FIGS. 11(a) through 11(e) are cross-sectional views illustrating respective process steps for fabricating a semiconductor device according to a seventh embodiment of the present invention.

First, as shown in FIG. 11(a), a first insulating film 701 is deposited over a semiconductor substrate 700 and an etch stopper film 702 is formed on the first insulating film 701.

Figure 11B:
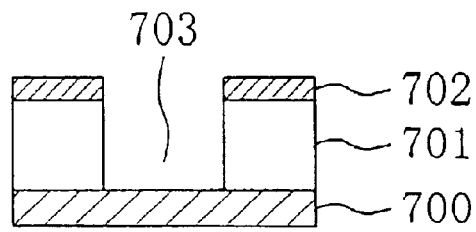
Figure 11C:
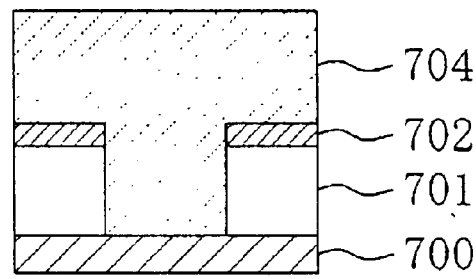

Next, a resist pattern (not shown) with an opening of a diameter greater than the width of an interconnection groove to be formed is defined on the etch stopper film 702. Then, the etch stopper film 702 and first insulating film 701 are plasma-etched using the resist pattern as a mask, thereby forming a provisional via hole 703 through the first insulating film 701 and etch stopper film 702 as shown in FIG. 11(b). The provisional via hole 703 has a relatively large diameter and expands horizontally (i.e., right- and leftwards in FIG. 11(b)) from a region where the interconnection groove will be formed. Then, as shown in FIG. 11(c), a second insulating film 704 is deposited over the entire surface of the etch stopper film 702. As a result, the provisional via hole 703 is filled in with the second insulating film 704.

Figure 11D:
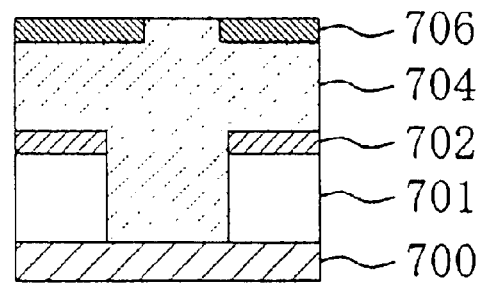

Then, as shown in FIG. 11(d), a silylated layer 706 is selectively formed in parts of the surface region of the second insulating film 704, where no interconnection grooves will be formed, as in the first embodiment. In other words, the silylated layer 706 will have an opening in the region where the interconnection groove will be formed.

Figure 11E:
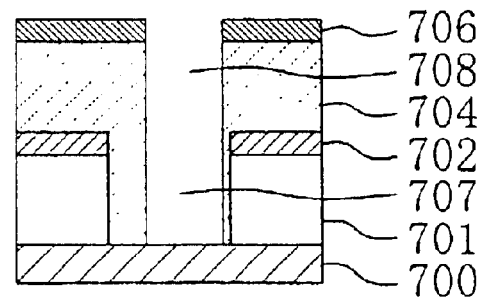

Thereafter, the second insulating film 704 is plasma-etched using the silylated layer 706 as a mask, thereby forming a real via hole 707 and an interconnection groove 708 with the same width as that of the real via hole 707 at a time as shown in FIG. 11(e).

Thereafter, the semiconductor substrate 700 is cleaned, a metal film (not shown) is deposited to fill in the real via hole 707 and interconnection groove 708 and then parts of the metal film, exposed on the silylated layer 706, are removed by a CMP process, for example. In this manner, a metal interconnect with a dual damascene structure is obtained.

In the seventh embodiment, the provisional via hole 703 of a relatively large diameter, which expands horizontally from the region where an interconnection groove will be defined, is formed through the first insulating film 701 and etch stopper film 702. Next, the second insulating film 704 is deposited over the etch stopper film 702 as well as the inside of the provisional via hole 703. And then the second insulating film 704 is plasma-etched using, as a mask, the silylated layer 706 with an interconnection groove opening. Accordingly, even if the opening (i.e., the region where the interconnection groove will be defined) of the silylated layer 706 is misaligned with the provisional via hole 703, the first insulating film 701 will not be exposed inside the real via hole 707. In addition, the diameter of the real via hole 707 will be no smaller than the width of the interconnection groove 708.

Furthermore, the metal interconnect with a dual damascene structure and a lower-level metal interconnect (not shown), which is located under the former metal interconnect, can be aligned with each other by themselves. That is to say, only by aligning these metal interconnects together, a sufficient area of contact is ensured between these interconnects.

Embodiment 8

Hereinafter, a method for fabricating a semiconductor device according to an eighth embodiment of the present invention will be described with reference to FIGS. 12(a) through 12(e).

Figure 12A:
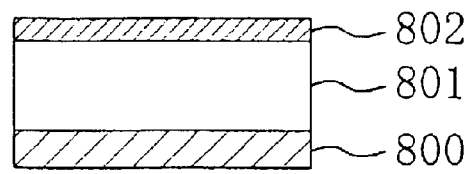
FIGS. 12(a) through 12(e) are cross-sectional views illustrating respective process steps for fabricating a semiconductor device according to an eighth embodiment of the present invention.

First, as shown in FIG. 12(a), a first insulating film 801 is deposited over a semiconductor substrate 800 and an etch stopper film 802 is formed on the first insulating film 801.

Figure 12B:
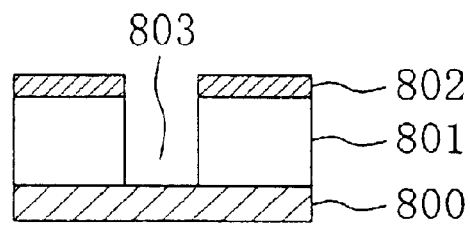
Figure 12C:
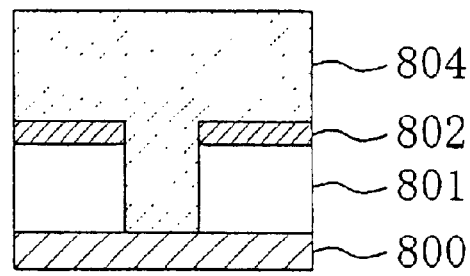

Next, a resist pattern (not shown) with an opening of a diameter smaller than the width of an interconnection groove to be formed is defined on the etch stopper film 802. Then, the etch stopper film 802 and first insulating film 801 are plasma-etched using the resist pattern as a mask, thereby forming a provisional via hole 803 through the first insulating film 801 and etch stopper film 802 as shown in FIG. 12(b). The provisional via hole 803 has a diameter smaller than the width of the interconnection groove. Then, as shown in FIG. 12(c), a second insulating film 804 is deposited over the entire surface of the etch stopper film 802. As a result, the provisional via hole 803 is filled in with the second insulating film 804.

Figure 12D:
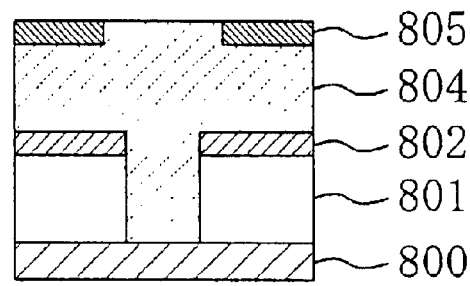
Figure 12E:
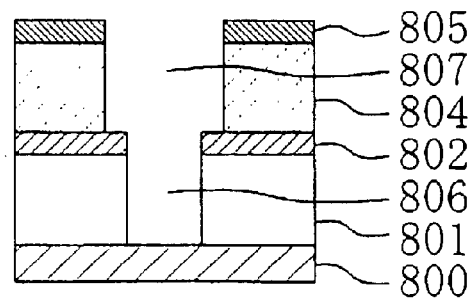

Then, as shown in FIG. 12(d), a silylated layer 805 is selectively formed in parts of the surface region of the second insulating film 804, where no interconnection grooves will be formed, as in the first embodiment. Thereafter, the second insulating film 804 is plasma-etched using the silylated layer 805 as a mask. In this manner, a real via hole 806 is formed by removing part of the second insulating film 804 that has been filled in the provisional via hole 803. In addition, an interconnection groove 807 with a width greater than that of the real via hole 806 is also formed through the second insulating film 804 as shown in FIG. 12(e).

Thereafter, the semiconductor substrate 800 is cleaned, a metal film (not shown) is deposited to fill in the via hole 806 and interconnection groove 807 and then parts of the metal film, exposed on the silylated layer 805, are removed by a CMP process, for example. In this manner, a metal interconnect with a dual damascene structure is obtained.

In the eighth embodiment, the provisional via hole 803 is formed through the first insulating film 801 and etch stopper film 802. Next, the second insulating film 804 is deposited over the etch stopper film 802. And then the second insulating film 804 is plasma-etched using, as a mask, the silylated layer 805 with an interconnection groove opening that has a width greater than the diameter of the provisional via hole 803. Accordingly, even if the opening of the silylated layer 805 is misaligned with the provisional via hole 806, the area of contact between the interconnection groove 807 and the real via hole 806 will not decrease. In addition, no residue of the second insulating film 804 will be left inside the real via hole 806. Thus, a metal interconnect with a dual damascene structure can be obtained without decreasing the contact area.

Furthermore, the metal interconnect with a dual damascene structure and a lower-level metal interconnect (not shown), which is located under the former metal interconnect, can be aligned with each other only by aligning the provisional via hole 803 with the lower-level interconnect. That is to say, only by aligning the provisional via hole 803 with the lower-level interconnect, a sufficient area of contact is ensured between these interconnects.

Embodiment 9

Hereinafter, a method for fabricating a semiconductor device according to a ninth embodiment of the present invention will be described with reference to FIGS. 13(a) through 14(c).

Figure 13A:
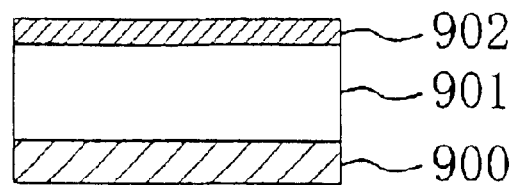
FIGS. 13(a) through 14(c) are cross-sectional views illustrating respective process steps for fabricating a semiconductor device according to a ninth embodiment of the present invention.

First, as shown in FIG. 13(a), a first insulating film 901 is deposited over a semiconductor substrate 900 and an etch stopper film 902 is formed on the first insulating film 901.

Figure 13B:
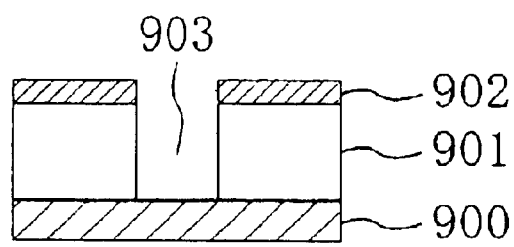

Next, a resist pattern (not shown) with a via hole opening is defined on the etch stopper film 902. Then, the etch stopper film 902 and first insulating film 901 are plasma-etched using the resist pattern as a mask, thereby forming a via hole 903 through the first insulating film 901 and etch stopper film 902 as shown in FIG. 13(b).

Figure 13C:
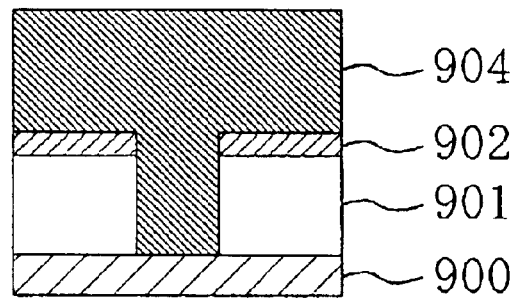

Subsequently, as shown in FIG. 13(c), a first metal film 904 is deposited over the entire surface of the etch stopper film 902 as well as the inside of the via hole 903. The first metal film 904 is preferably made of a metal with a low resistance. Examples of those low-resistance metals include: tungsten (W); polysilicon; TiN; Al; Al alloy (produced by adding Si and/or Cu to Al); Cu; Cu alloy mainly composed of Cu; Ag; and Au.

Figure 13D:
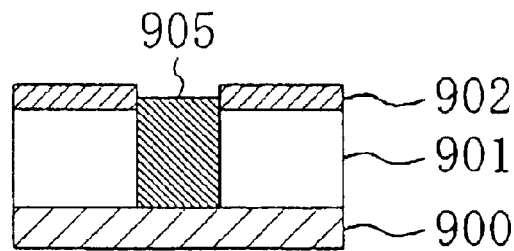
Figure 14A:
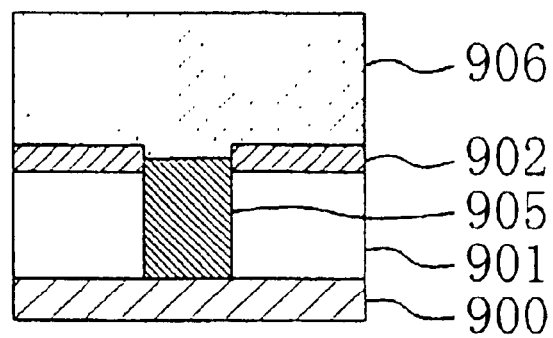

Next, as shown in FIG. 13(d), parts of the first metal film 904 that are exposed on the etch stopper film 902 are removed by a CMP process, for example, thereby forming a plug 905. Then, as shown in FIG. 14(a), a second insulating film 906 is deposited over the entire surface of the plug 905 and etch stopper film 902.

Figure 14B:
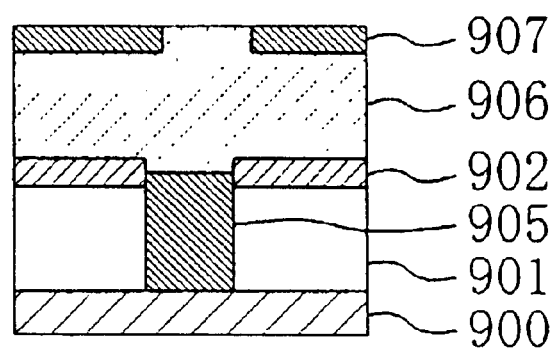
Figure 14C:
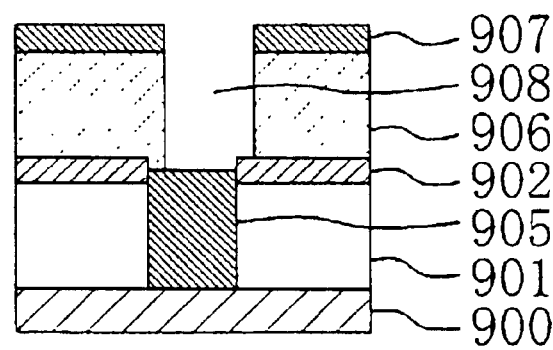

Thereafter, as shown in FIG. 14(b), a silylated layer 907 is selectively formed in parts of the surface region of the second insulating film 906, where no interconnection grooves will be formed. Then, the second insulating film 906 is plasma-etched using the silylated layer 907 as a mask. In this manner, an interconnection groove 908 is formed through the second insulating film 906 as shown in FIG. 14(c).

Next, the semiconductor substrate 900 is cleaned, a second metal film (not shown) is deposited to fill in the interconnection groove 908 and then parts of the second metal film, exposed on the silylated layer 907, are removed by a CMP process, for example. In this manner, a metal interconnect is formed.

In the ninth embodiment, the interconnection groove 908, which will be connected to the plug 905, is formed by plasma-etching the second insulating film 906 using the silylated layer 907, which has been formed selectively in the surface region of the second insulating film 906, as a mask. Thus, no resist patterns are needed in this process step.

As a result, a resist-free process is realized and there is no need to perform the process step of ashing a resist pattern away or excessively over-etching the second insulating film 906. Thus, the quality of the second insulating film 906 does not degrade and the interconnection groove 908 is not deformed, either.

MODIFIED EXAMPLE 1 OF EMBODIMENT 9

Figure 15A:
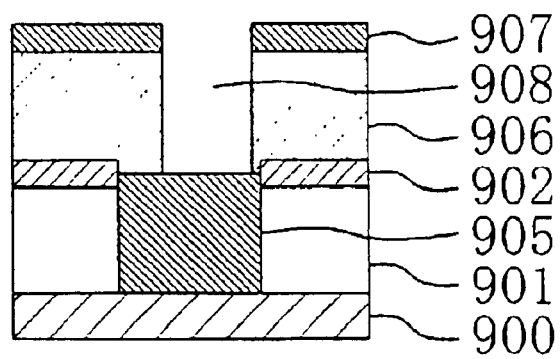
FIGS. 15(a) and 15(b) are cross-sectional views illustrating process steps for fabricating a semiconductor device according first and second modified examples of the ninth embodiment, respectively.

In a first modified example of the ninth embodiment, a plug 905 of a relatively great diameter, which expands horizontally from the region where the interconnection groove will be defined, is formed as in the seventh embodiment through the first insulating film 901 as shown in FIG. 15(a). Then, the interconnection groove 908 is formed by plasma-etching the second insulating film 906 using, as a mask, the silylated layer 907 with an interconnection groove opening.

Accordingly, even if the opening of the silylated layer 907 is misaligned with the plug 905, the diameter of the plug 905 will be no smaller than the width of the interconnection groove 908.

MODIFIED EXAMPLE 2 OF EMBODIMENT 9

Figure 15B:
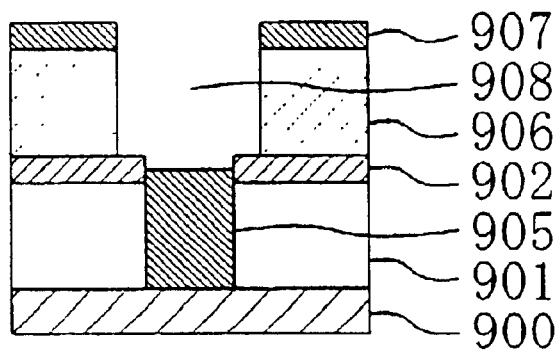

In a second modified example of the ninth embodiment, a plug 905 is formed as in the eighth embodiment through the first insulating film 901 as shown in FIG. 15(b). Then, the interconnection groove 908 is formed by plasma-etching the second insulating film 906 using, as a mask, the silylated layer 907 with an interconnection groove opening that has a width greater than the diameter of the plug 905.

Accordingly, even if the opening of the silylated layer 907 is misaligned with the plug 905, the area of contact between the interconnection groove 908 and plug 905 will not decrease.

Embodiment 10

Hereinafter, a method for fabricating a semiconductor device according to a tenth embodiment of the present invention will be described with reference to FIGS. 16(a) through 17(d).

Figure 16A:
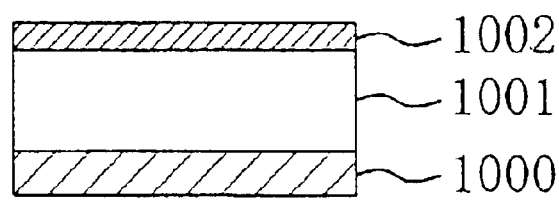
FIGS. 16(a) through 17(d) are cross-sectional views illustrating respective process steps for fabricating a semiconductor device according to a tenth embodiment of the present invention.

First, as shown in FIG. 16(a), a first insulating film 1001 is deposited over a semiconductor substrate 1000 and an etch stopper film 1002 is formed on the first insulating film 1001.

Figure 16B:
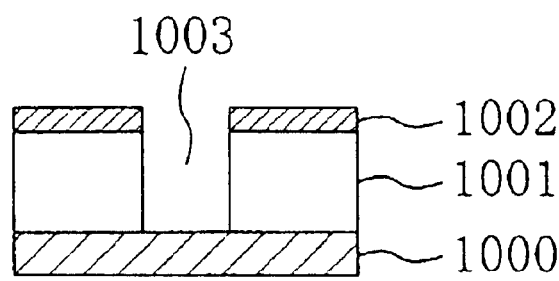
Figure 16C:
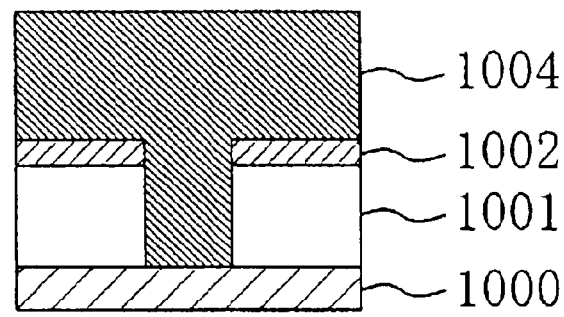

Next, a resist pattern (not shown) with a via hole opening is defined on the etch stopper film 1002. Then, the etch stopper film 1002 and first insulating film 1001 are plasma-etched using the resist pattern as a mask, thereby forming a via hole 1003 through the first insulating film 1001 and etch stopper film 1002 as shown in FIG. 16(b). Subsequently, as shown in FIG. 16(c), a first metal film 1004 is deposited over the entire surface of the etch stopper film 1002 as well as the inside of the via hole 1003. The first metal film 1004 is preferably made of the same low-resistance metal as the first metal film 904 of the ninth embodiment.

Figure 16D:
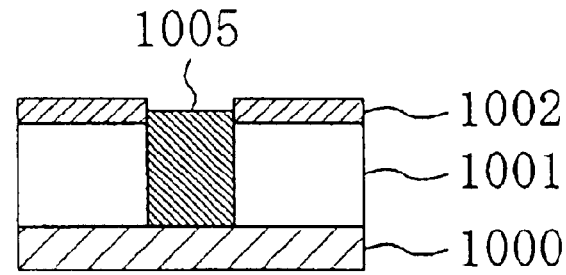
Figure 17A:
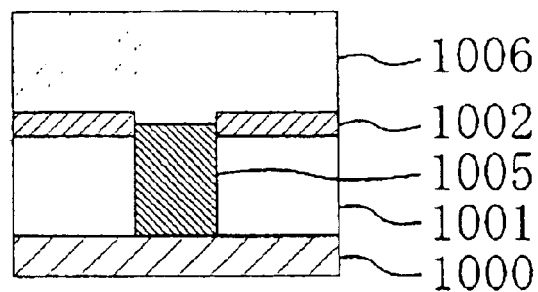

Next, as shown in FIG. 16(d), parts of the first metal film 1004 that are exposed on the etch stopper film 1002 are removed by a CMP process, for example, thereby forming a plug 1005. Then, as shown in FIG. 17(a), a second insulating film 1006 is deposited over the entire surface of the plug 1005 and etch stopper film 1002.

Figure 17B:
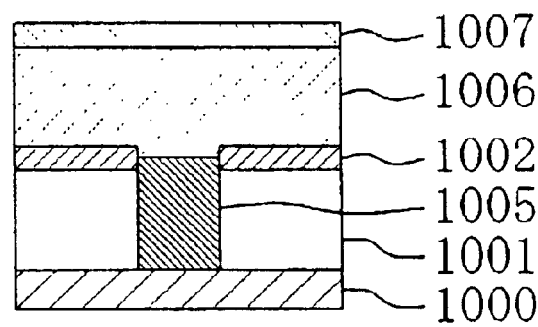
Figure 17C:
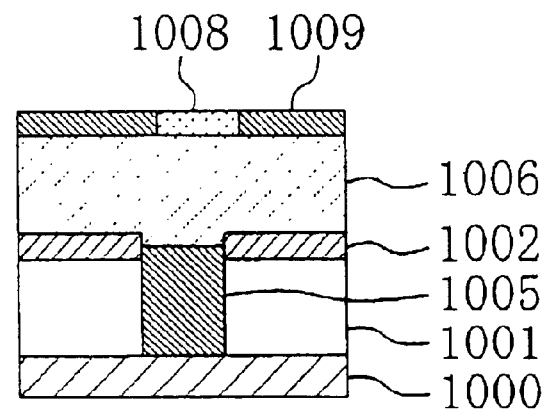

Thereafter, as shown in FIG. 17(b), the surface of the second insulating film 1006 is coated with a chemically amplified resist, of which the main polymer is polyhydroxystyrene, for example, thereby forming a layer 1007 to be silylated thereon. Next, the surface of the layer 1007 to be silylated is selectively exposed to a high-energy radiation through a reticle. As a result, an altered layer 1008 is formed in only the exposed parts of the surface of the layer 1007 to be silylated as shown in FIG. 17(c). Subsequently, a silylation process is carried out by exposing the surface of the layer 1007 to be silylated to a vapor of hexamethyldisilazane (HMDS). As a result, a silylated layer 1009 is formed selectively in the non-exposed parts of the layer 1007 to be silylated as shown in FIG. 17(c).

Figure 17D:
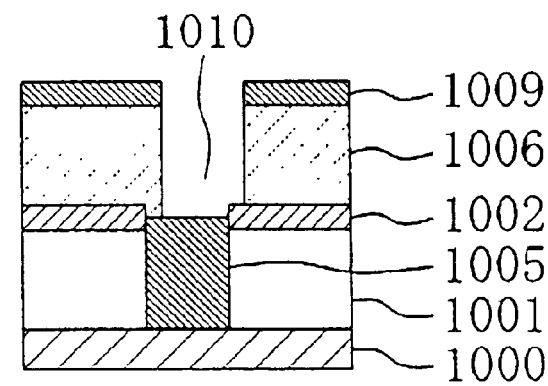

Subsequently, after the altered layer 1008 has been removed, the second insulating film 1006 is plasma-etched using the silylated layer 1009 as a mask. In this manner, an interconnection groove 1010 is formed through the second insulating film 1006 as shown in FIG. 17(d).

Thereafter, the semiconductor substrate 1000 is cleaned, a second metal film (not shown) is deposited to fill in the interconnection groove 1010 and then parts of the second metal film, exposed on the silylated layer 1009, are removed by a CMP process, for example. In this manner, a metal interconnect is formed.

In the tenth embodiment, the interconnection groove 1010, which will be connected to the plug 1005, is formed by plasma-etching the second insulating film 1006 using the silylated layer 1009, which has been formed selectively on the second insulating film 1006, as a mask. Thus, no resist patterns are needed in this process step.

As a result, a resist-free process is realized and there is no need to perform the process step of ashing a resist pattern away or excessively over-etching the second insulating film 1006. Thus, the quality of the second insulating film 1006 does not degrade and the interconnection groove 1010 is not deformed, either.

In addition, as in the second embodiment, the silylated layer 1009 can always be formed irrespective of the quality of the second insulating film 1006.

Embodiment 11

Hereinafter, a method for fabricating a semiconductor device according to an eleventh embodiment of the present invention will be described with reference to FIGS. 18(a) through 19(c).

Figure 18A:
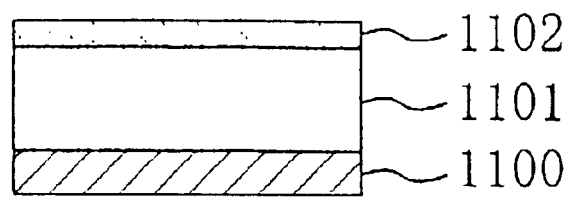
FIGS. 18(a) through 19(c) are cross-sectional views illustrating respective process steps for fabricating a semiconductor device according to an eleventh embodiment of the present invention.

First, as shown in FIG. 18(a), a first insulating film 1101, which may be an organic insulating film, for example, is deposited over a semiconductor substrate 1100. Then, the surface of the first insulating film 1101 is coated with a chemically amplified resist, of which the main polymer is polyhydroxystyrene, for example, thereby forming a first layer 1102 to be silylated thereon.

Figure 18B:
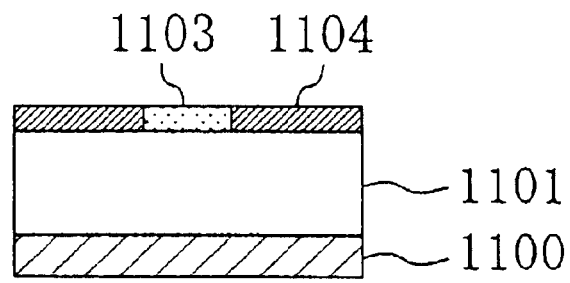

Next, the surface of the first layer 1102 to be silylated is selectively exposed to a high-energy radiation through a reticle. As a result, a first altered layer 1103 is formed in only the exposed parts of the surface of the first layer 1102 to be silylated as shown in FIG. 18(b). Subsequently, a silylation process is carried out by exposing the surface of the first layer 1102 to be silylated to a vapor of hexamethyldisilazane (HMDS). As a result, a first silylated layer 1104 is formed selectively in the non-exposed parts of the first layer 1102 to be silylated as shown in FIG. 18(b).

Figure 18C:
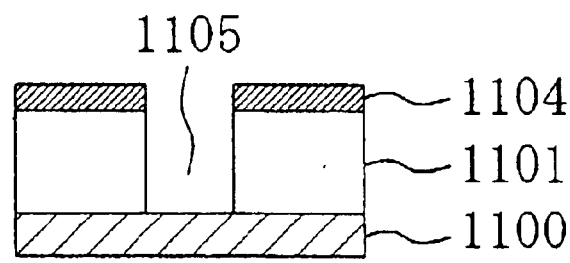

Subsequently, the first insulating film 1101 is plasma-etched using the first silylated layer 1104 as a mask. In this manner, a provisional via hole 1105 is formed through the first insulating film 1101 and first silylated layer 1104 as shown in FIG. 18(c).

Figure 18D:
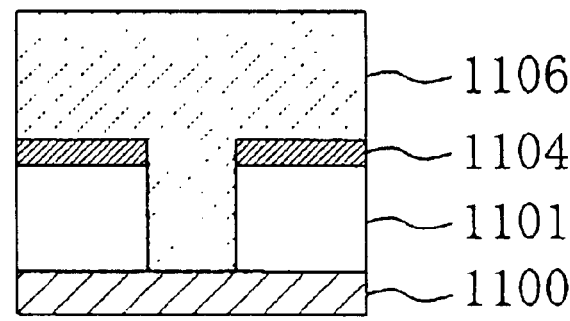
Figure 19A:
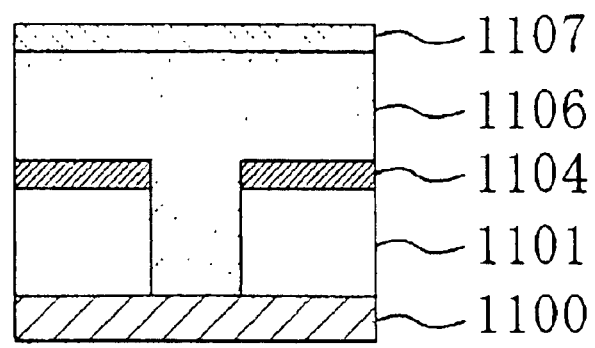

Next, as shown in FIG. 18(d), a second insulating film 1106, which may be an organic insulating film, for example, is deposited over the entire surface of the first silylated layer 1104. Then, as shown in FIG. 19(a), the surface of the second insulating film 1106 is coated with a chemically amplified resist, of which the main polymer is polyhydroxystyrene, for example, thereby forming a second layer 1107 to be silylated thereon.

Figure 19B:
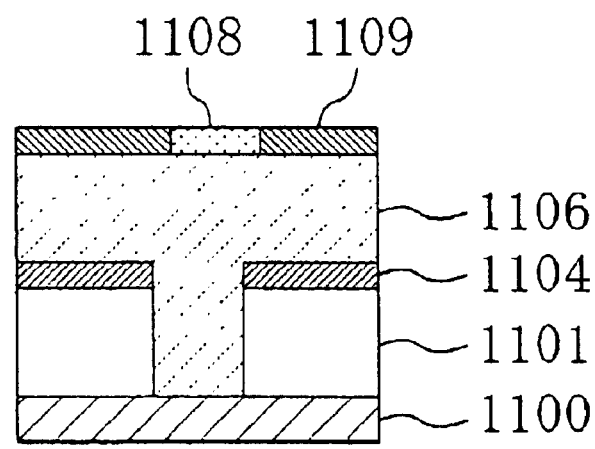

Next, the surface of the second layer 1107 to be silylated is selectively exposed to a high-energy radiation through a reticle. As a result, a second altered layer 1108 is formed in only the exposed parts of the surface of the second layer 1107 to be silylated as shown in FIG. 19(b). Subsequently, a silylation process is carried out by exposing the surface of the second layer 1107 to be silylated to a vapor of hexamethyldisilazane (HMDS). As a result, a second silylated layer 1109 is formed selectively in the non-exposed parts of the second layer 1107 to be silylated as shown in FIG. 19(b).

Figure 19C:
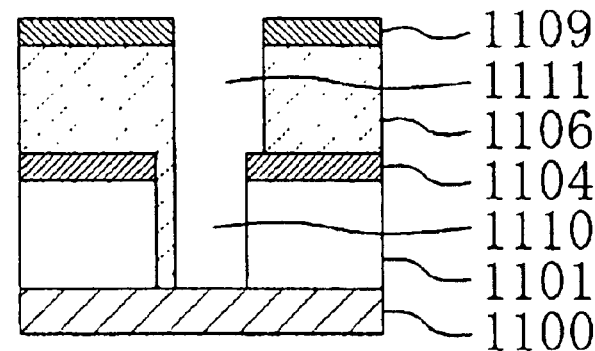
Figure 20A:
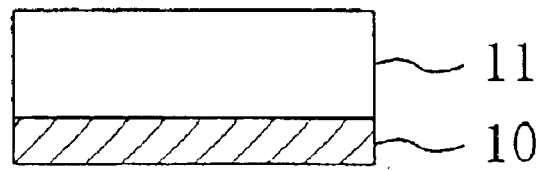
FIGS. 20(a) through 20(d) are cross-sectional views illustrating respective process steps for fabricating a semiconductor device according to a first prior art example.
Figure 20B:
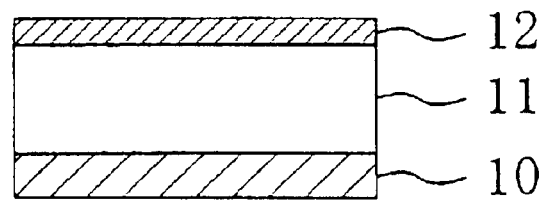
Figure 20C:
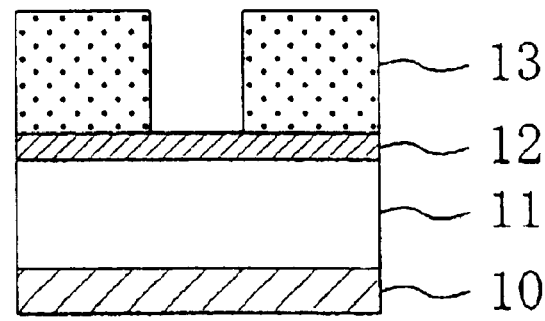
Figure 20D:
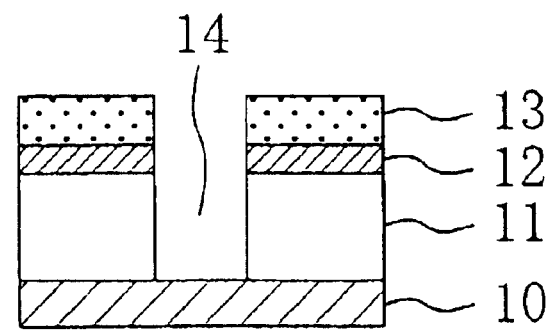
Figure 21A:
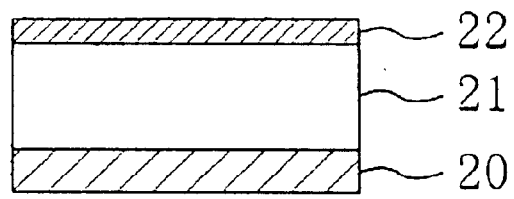
FIGS. 21(a) through 22(c) are cross-sectional views illustrating respective process steps for fabricating a semiconductor device according to a second prior art example.
Figure 21B:
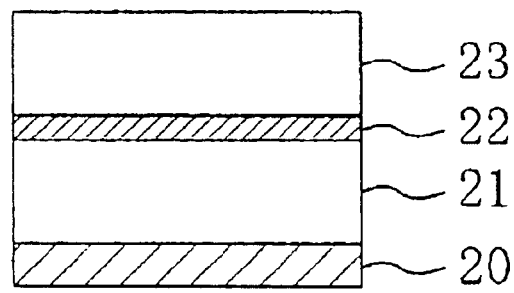
Figure 21C:
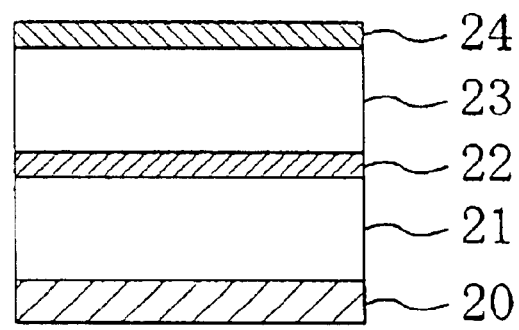
Figure 21D:
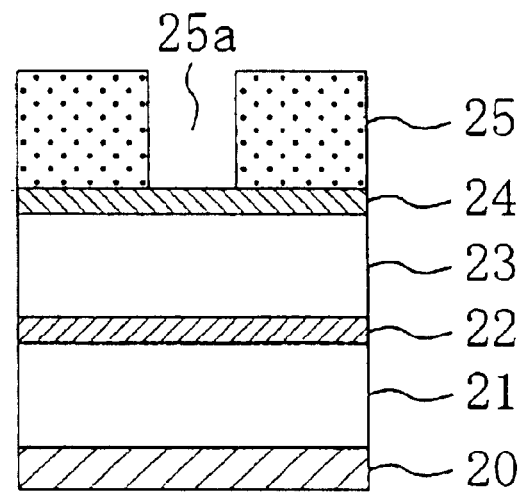
Figure 22A:
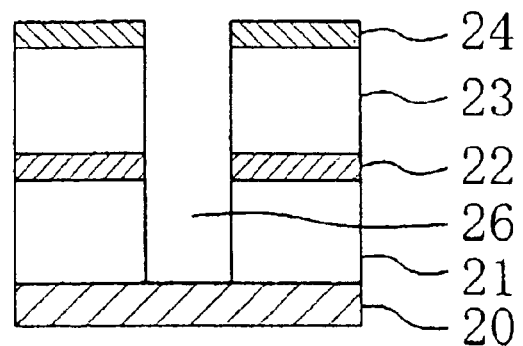
Figure 22B:
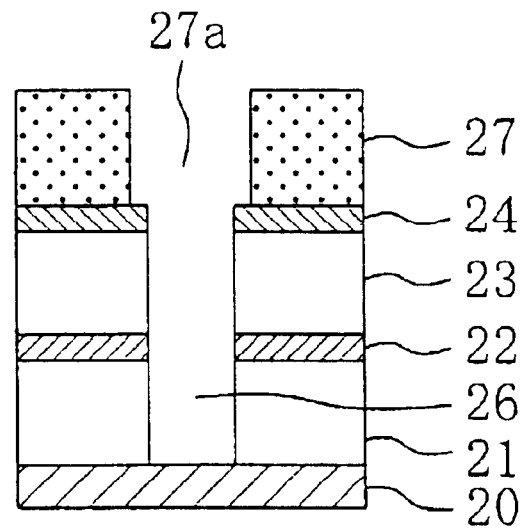
Figure 22C:
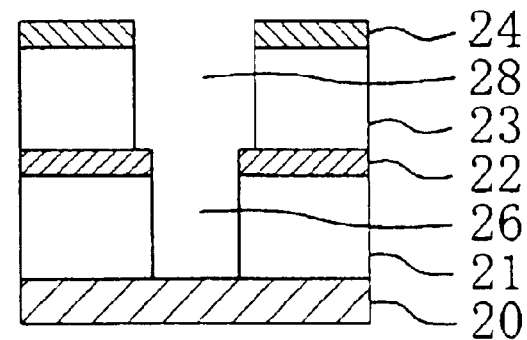
Figure 23A:
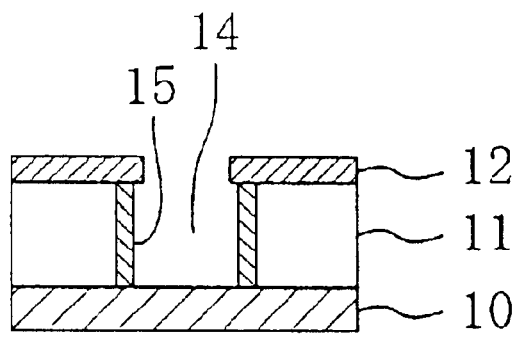
FIG. 23(a) is a cross-sectional view illustrating a problem involved with the semiconductor device fabrication process of the first prior art example.
Figure 23B:
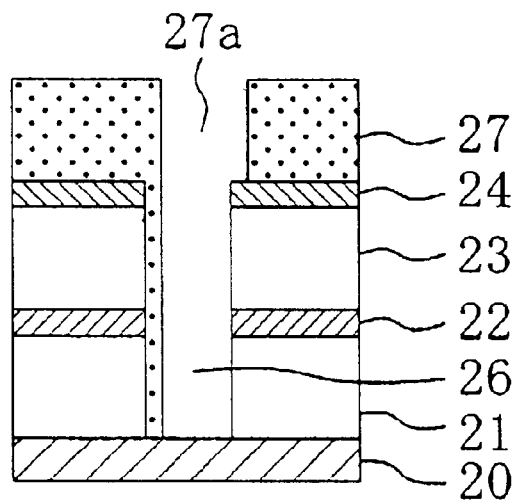
FIGS. 23(b) and 23(c) are cross-sectional views illustrating problems involved with the semiconductor device fabrication process of the second prior art example.
Figure 23C:
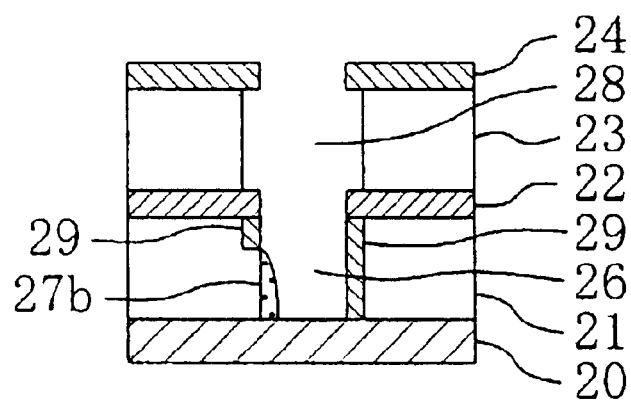

Subsequently, the second insulating film 1106 is plasma-etched using the second silylated layer 1109 as a mask. In this manner, a real via hole 1110 is formed through the first insulating film 1101 and an interconnection groove 1111 is formed through the second insulating film 1106 as shown in FIG. 19(c).

Thereafter, the semiconductor substrate 1100 is cleaned, a second metal film (not shown) is deposited to fill in the real via hole 1110 and interconnection groove 1111 and then parts of the second metal film, exposed on the second silylated layer 1109, are removed by a CMP process, for example. In this manner, a metal interconnect with a dual damascene structure is obtained.

In the eleventh embodiment, the first insulating film 1101 is plasma-etched using the first silylated layer 1104, which has been formed selectively on the first insulating film 1101, as a mask. In the same way, the second insulating film 1106 is plasma-etched using the second silylated layer 1109, which has been formed selectively on the second insulating film 1106, as a mask. Thus, no resist patterns are needed in these process steps.

As a result, a resist-free process is realized and there is no need to perform the process step of ashing a resist pattern away or excessively over-etching the second insulating film 1106. Thus, the quality of the second insulating film 1106 does not degrade and the interconnection groove 1111 is not deformed, either.

Also, after the first silylated layer 1104 has been formed between the first and second insulating films 1101 and 1106, the second insulating film 1106 is plasma-etched using the second silylated layer 1109, which has been formed selectively on the surface of the second insulating film 1106, as a mask. In this manner, the real via hole 1110 and interconnection groove 1111 are formed. Thus, no etch selectivity is needed between the first and second insulating films 1101 and 1106. In addition, the first and second silylated layers 1104 and 1109 can always be formed irrespective of the quality of the first and second insulating films 1101 and 1106.

The thicknesses of the first and second silylated layers 1104 and 1109 may be somewhere between about 100 nm and about 200 nm. Thus, compared to a normal resist process using a resist film that should be at least 500 nm thick, the effective depth of focus can be increased by about two to fivefold. Accordingly, the problem of depth of focus can be solved.

Furthermore, if the surface planarity of the semiconductor substrate 1100 is not so good, an organic insulating film formed by a spin coating process is preferably used as the first insulating film 1101. Then, the planarity of the first insulating film 1101 can be superior to that of the semiconductor substrate 1100.

In the eleventh embodiment, the first and second silylated layers 1104 and 1109 are formed by conducting a silylation process on the non-altered parts of the first and second layers 1102 and 1107 to be silylated. Alternatively, the first and second silylated layers 1104 and 1109 may be formed by terminating the surfaces of the first and second insulating films 1101 and 1106 with hydroxyls and then conducting a silylation process on the non-exposed (non-altered) parts thereof terminated with the hydroxyls as in the first embodiment.

In the foregoing first through eleventh embodiments, low dielectric constant films such as organic, inorganic or organic/inorganic hybrid films are used as the first and second insulating films. However, the same effects as those described for the first through eleventh embodiments are also attainable by optimizing etching conditions, for example, even if at least one of the first and second insulating films is a porous film with vacancies in the molecular structure thereof.

In that case, the porous film may have either a microscopic molecular structure having vacancies of a size approximately equal to a group of several atoms or a macroscopic molecular structure having vacancies of a size approximately equal to a group of several molecules.

What is claimed is:

1. A method for fabricating a semiconductor device, comprising the steps of:
   a) depositing an organic insulating film over a semiconductor substrate;
   b) forming a silylated layer selectively in a top surface of the organic insulating film by silylating the organic insulating film using a resist-free process; and
   c) etching the organic insulating film using the silylated layer as a mask, thereby forming an opening in the organic insulating film.

2. The method of claim 1, wherein a porous insulating film is used instead of the organic insulating film.

3. The method of claim 1, wherein the step b) comprises the steps of;
   terminating a surface of the organic insulating film with hydroxyls;
   selectively exposing the surface of the organic insulating film to a high-energy radiation, thereby removing the hydroxyls from exposed parts of the organic insulating film; and
   supplying a silylation reagent onto the selectively-exposed surface of the organic insulating file, thereby forming the silylated layer on the surface of non-exposed parts of the organic insulating file.

4. The method of claim 1, wherein the step b) comprise the steps of:
   forming a layer to be silylated over the organic insulating film;
   selectively exposing a surface of the layer to be silylated to a high-energy radiation;
   supplying a silylation reagent onto the selectively-exposed surface of the layer to be silylated, thereby forming the silylated layer selectively in exposed or non-exposed parts of the layer lobe silylated; and
   removing the exposed or non-exposed parts of the layer to be silylated, in which the silylated layer has not been formed.

5. The method of claim 1, wherein the step b) comprises the steps of:
   forming an altered layer by partially modifying a top surface portion of the organic insulating film using the resist-free process; and
   forming the silylated layer selectively in a top surface portion of the organic insulating film excluding the altered layer.

6. The method of claim 1, wherein the organic insulating film is made of an organic compound having a benzene ring.

7. A method for fabricating a semiconductor device, comprising the steps of:
   a) depositing a first insulating film over a semiconductor substrate;
   b) forming a via hole through the first insulating film;
   c) depositing a second insulating film, which has an etch selectivity with respect to the first insulating film, over the first insulating film;
   d) forming a silylated layer selectively in a top surface of the second insulating film; and
   e) etching the second insulating film using the silylated layer as a mask, thereby forming an interconnection groove through the second insulating film and removing part of the second insulating film that has been filled in the via hole.

8. The method of claim 7, wherein the diameter of the via hole is greater than the width of the interconnection groove.

9. The method of claim 7, wherein the width of the interconnection groove is greater than the diameter of the via hole.

10. The method of claim 7, wherein at least one of the first and second insulating films is a porous insulating film.

11. The method of claim 7, wherein the first insulating film is an inorganic insulating film, organic/inorganic hybrid film or CVD organic insulating film, and
    wherein the second insulating film is an organic insulating film.

12. A method for fabricating a semiconductor device, comprising the steps of:
    a) depositing a first insulating film over a semiconductor substrate;
    b) forming an etch stopper film over the first insulating film;
    c) forming a via hole through the first insulating and etch stopper films;
    d) depositing a second insulating film over the etch stopper film;
    e) forming a silylated layer selectively in a top surface of the second insulating film; and
    f) etching the second insulating film using the silylated layer as a mask, thereby forming an interconnection groove through the second insulating film and removing part of the second insulating film that has been filled in the via hole.

13. The method of claim 12, wherein the diameter of the via hole is greater than the width of the interconnection groove.

14. The method of claim 12, wherein the width of the interconnection groove is greater than the diameter of the via hole.

15. The method of claim 12, wherein at least one of the first and second insulating films is a porous insulating film.

16. The method of claim 12, wherein the first insulating film is an organic insulating film or organic/inorganic hybrid film, and
    wherein the second insulating film is an organic insulating film.

17. A method for fabricating a semiconductor device, comprising the steps of:
    a) depositing a first insulating film over a semiconductor substrate;
    b) forming an etch stopper film over the first insulating film;
    c) forming a via hole through the etch stopper film;
    d) depositing a second insulating film over the etch stopper film;
    e) forming a silylated layer selectively in a top surface of the second insulating film; and
    f) etching the second and first insulating films using the silylated layer as a mask, thereby forming an interconnection groove through the second insulating film and another via hole through the first insulating film so that the via holes of the etch stopper and first insulating films are connected together.

18. The method of claim 17, wherein the diameter of the via holes is greater than the width of the interconnection groove.

19. The method of claim 17, wherein the width of the interconnection groove is greater than the diameter of the via holes.

20. The method of claim 17, wherein at least one of the first and second insulating films is a porous insulating film.

21. The method of claim 17, wherein the first insulating film is an organic insulating film or organic/inorganic hybrid film, and
wherein the second insulating film is an organic insulating film.

22. A method for fabricating a semiconductor device, comprising the steps of:
    a) depositing a first insulating film over a semiconductor substrate;
    b) forming an etch stopper film over the first insulating film;
    c) forming a via hole through the first insulating and etch stopper films;
    d) forming a plug by filling in the via hole with a metal film;
    e) depositing a second insulating film over the plug and the etch stopper film;
    f) forming a silylated layer selectively in a top surface portion of the second insulating film by silylating the second insulating film using a resist-free process; and
    g) etching the second insulating film using the silylated layer as a mask, thereby forming an interconnection groove through the second insulating film.

23. The method of claim 22, wherein the diameter of the via hole is greater than the width of the interconnection groove.

24. The method of claim 22, wherein the width of the interconnection groove is greater than the diameter of the via hole.

25. The method of claim 22, wherein at least one of the first and second insulating films is a porous insulating film.

26. The method of claim 22, wherein the first insulating film is an inorganic insulating film, organic/inorganic hybrid film or CVD organic insulating film, and
wherein the second insulating film is an organic insulating film.

27. The method of claim 22, wherein the first insulating film is an organic insulating film or organic/inorganic hybrid film, and
wherein the second insulating film is an organic insulating film.

28. The method of claim 22, wherein the step f) comprises the steps of:
    forming an altered layer by partially modifying a top of surface portion of the second insulating film using the resist-free process; and
    forming the silylated layer selectively in a top surface portion of the second insulating film excluding the altered layer.

29. The method of claim 22, wherein the second insulating film is made of an organic compound having a benzene ring.

30. A method for fabricating a semiconductor device, comprising the steps of:
    a) depositing a first insulating film over a semiconductor substrate;
    b) forming a first silylated layer, selectively in a top surface of the first insulating film;
    c) etching the first insulating film using the first silylated layer as a mask, thereby forming a via hole through the first insulating film;
    d) depositing a second insulating film over the first silylated layer;
    e) forming a second silylated layer selectively in a top surface of the second insulating film; and
    f) etching the second insulating film using the second silylated layer as a mask, thereby forming an interconnection groove through the second insulating film and removing part of the second insulating film that has been filled in the via hole.

31. The method of claim 30, wherein at least one of the first and second insulating films is a porous insulating film.

32. A method for fabricating a semiconductor device, comprising the steps of:
    a) depositing an organic insulating film over a semiconductor substrate;
    b) forming a silylated layer selectively in a top surface portion of the organic insulating film by silylating the organic insulating film using a resist-free process; and
    c) etching the organic insulating film using the silylated layer as a mask.

33. The method of claim 32, wherein the step b) comprises the steps of:
    terminating a surface of the organic insulating film with hydroxyls;
    selectively exposing the surface of the organic insulating film to a high-energy radiation, thereby removing the hydroxyls from exposed parts of the organic insulating film; and
    supplying a silylation reagent onto the selectively-exposed surface of the organic insulating film, thereby forming the silylated layer on the surface of non-exposed parts of the organic insulating film.

34. The method of claim 32, wherein the step b) comprises the steps of:
    forming a layer to be silylated over the organic insulating film;
    selectively exposing a surface of the layer to be silylated to a high-energy radiation;
    supplying a silylation reagent onto the selectively-exposed surface of the layer to be silylated, thereby forming the silylated layer selectively in exposed or non-exposed parts of the layer to be silylated; and
    removing the exposed or non-exposed parts of the layer to be silylated, in which the silylated layer has not been formed.

35. The method of claim 32, wherein a porous insulating film is used instead of the organic insulating film.

36. The method of claim 32, wherein the step b) comprises the steps of:
    forming an altered layer by partially modifying a top surface portion of the organic insulating film using the resist-free process; and
    forming the silylated layer selectively in a top surface portion of the organic insulating film excluding the altered layer.

37. The method of claim 32, wherein the organic insulating film is made of an organic compound having a benzene ring.

* * * * *